(12) United States Patent
Seshita et al.

(10) Patent No.: US 10,707,823 B1
(45) Date of Patent: Jul. 7, 2020

(54) HIGH-FREQUENCY AMPLIFIER CIRCUITRY AND SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Toshiki Seshita, Kawasaki Kanagawa (JP); Yasuhiko Kuriyama, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/535,146

(22) Filed: Aug. 8, 2019

(30) Foreign Application Priority Data

Feb. 7, 2019 (JP) .................................. 2019-020729

(51) Int. Cl.
| H04B 1/00 | (2006.01) |
| H04M 1/00 | (2006.01) |
| H03G 3/30 | (2006.01) |
| H03F 1/02 | (2006.01) |
| H02P 29/40 | (2016.01) |

(52) U.S. Cl.
CPC ........... H03G 3/3042 (2013.01); H02P 29/40 (2016.02); H03F 1/0277 (2013.01)

(58) Field of Classification Search
CPC ................. H03F 2200/45; H03F 3/193; H03F 2200/294; H03F 3/211; H03F 3/195; H03F 3/245; H03F 3/72; H03F 1/565; H03F 1/22; H03F 2200/111; H03F 1/3205; H03F 2203/7209; H03F 1/0205; H03F 2200/372; H03F 3/45192; H03F 3/602; H04B 1/006; H04B 1/04; H04B 1/16; H04B 1/401; H04B 1/0475; H04W 88/06

See application file for complete search history.

(56) References Cited

U.S. PATENT DOCUMENTS

| 5,300,897 A | 4/1994 | Shiga |
| 6,665,159 B2 | 12/2003 | Takikawa et al. |
| (Continued) | | |

FOREIGN PATENT DOCUMENTS

| JP | H05-129856 A | 5/1993 |
| JP | H10-215122 A | 8/1998 |
| (Continued) | | |

*Primary Examiner* — Quochien B Vuong
(74) *Attorney, Agent, or Firm* — White & Case LLP

(57) ABSTRACT

High-frequency amplifier circuitry includes first amplifier circuitry, second amplifier circuitry, and noise figure improving circuitry. The first amplifier circuitry includes a first transistor and a grounded-gate third transistor. The first transistor has a source grounded via a first source inductor and a gate to which an input signal is applied. The third transistor is configured to output from a drain a signal obtained by amplifying a signal outputted from a drain of the first transistor. The second amplifier circuitry includes a same circuit constant as a circuit constant of the first amplifier circuitry and includes a second transistor and a grounded-gate fourth transistor. The noise figure improving circuitry connects the source of the first transistor and the source of the second transistor to each other.

17 Claims, 38 Drawing Sheets

(56) References Cited

U.S. PATENT DOCUMENTS

| | | | |
|---|---|---|---|
| 7,839,219 B2 * | 11/2010 | Kuo | H03F 1/56 330/301 |
| 7,898,339 B2 * | 3/2011 | Ikeda | H03F 1/223 330/285 |
| 7,920,024 B2 * | 4/2011 | Rysinski | H03F 1/083 330/253 |
| 8,975,968 B2 * | 3/2015 | Abdelhalem | H03F 1/223 330/311 |
| 9,923,525 B2 | 3/2018 | Matsuno | |
| 10,256,775 B2 | 4/2019 | Seshita et al. | |
| 2016/0268978 A1 | 9/2016 | Matsuno | |

FOREIGN PATENT DOCUMENTS

| | | |
|---|---|---|
| JP | 2001-237372 A | 8/2001 |
| JP | 4037029 B2 | 1/2008 |
| JP | 2016-171163 A | 9/2016 |
| JP | 2018-201069 A | 12/2018 |

* cited by examiner

| OUTPUT MODE | ACTIVE OUTPUT | VB21 | VB22 | Cont1 | Cont2 | Cont3 | Cont4 | Rd1 Rd2 | SW1 | SW2 |
|---|---|---|---|---|---|---|---|---|---|---|
| SINGLE OUTPUT | OUT1 | ON | OFF | H | L | L | L | LOW | ON | OFF |
| SINGLE OUTPUT | OUT2 | OFF | ON | L | H | H | L | LOW | OFF | ON |
| SPLIT OUTPUT | OUT & OUT2 | ON | ON | H | H | L | H | HIGH | ON | ON |

FIG. 6

| Band41 | | | | | | |
|---|---|---|---|---|---|---|
| MODE | Idd_lna (mA) | S21 (dB) fcenter | NF (dB) fcenter | WITHIN S11 (dB) RANGE | WITHIN S22 (dB) RANGE | WITHIN S23 (dB) RANGE |
| Single | 6.8 | 18.02 | 0.85 | -8.7 | -14.5 | - |
| Split | 12.6 | 17.04 | 0.96 | -8.1 | -12.7 | -35.1 |

FIG.11

| Band41 | | | | | | |
|---|---|---|---|---|---|---|
| MODE | Idd_lna (mA) | S21 (dB) fcenter | NF (dB) fcenter | WITHIN S11 (dB) RANGE | WITHIN S22 (dB) RANGE | WITHIN S23 (dB) RANGE |
| Single | 6.3 | 18.13 | 0.746 | -9.735 | -13.39 | – |
| Split | 12.6 | 17.14 | 0.822 | -8.52 | -12.71 | -32.40 |

FIG.19

| OUTPUT MODE | ACTIVE OUTPUT | VDD1 | VDD2 | VB21 VB31 | VB22 VB32 | Cont1 | Cont2 | Cont3 | Cont4 | Rd1 Rd2 | SW1 | SW2 |
|---|---|---|---|---|---|---|---|---|---|---|---|---|
| SINGLE OUTPUT | OUT1 | ON | OFF | ON | OFF | H | L | H | L | LOW | ON | OFF |
| SINGLE OUTPUT | OUT2 | OFF | ON | OFF | ON | L | H | H | L | LOW | OFF | ON |
| SPLIT | OUT1 & OUT2 | ON | ON | ON | ON | H | H | L | H | HIGH | ON | ON |

FIG.22

Band41

| MODE | Idd_Ina (mA) | S21 (dB) fcenter | NF (dB) fcenter | WITHIN S11 (dB) RANGE | WITHIN S22 (dB) RANGE | WITHIN S23 (dB) RANGE |
|---|---|---|---|---|---|---|
| Single | 5.94 | 18.02 | 0.83 | -13.1 | -14.5 | – |
| Split | 11.87 | 17.2 | 0.87 | -12.4 | -13.1 | -30.2 |

FIG.27

| OUTPUT MODE | ACTIVE OUTPUT | VB21 | VB22 | Rd1 Rd2 | Sw1 | Sw2 | Sw3 Sw4 |
|---|---|---|---|---|---|---|---|
| SINGLE OUTPUT | OUT1 | ON | OFF | LOW | ON | OFF | OFF |
| | OUT2 | OFF | ON | | OFF | ON | OFF |
| SPLIT OUTPUT | OUT & OUT2 | ON | ON | HIGH | ON | ON | ON |

FIG.30

| Band41 | | | | | | |
|---|---|---|---|---|---|---|
| MODE | Idd_lna (mA) | S21 (dB) fcenter | NF (dB) fcenter | WITHIN S11 (dB) RANGE | WITHIN S22 (dB) RANGE | WITHIN S23 (dB) RANGE |
| Single | 6.3 | 18.02 | 0.85 | -8.7 | -14.5 | — |
| Split | 12.6 | 17.04 | 0.96 | -8.1 | -12.6 | -34.8 |

HIGH-FREQUENCY AMPLIFIER CIRCUITRY AND SEMICONDUCTOR DEVICE

CROSS REFERENCE TO RELATED APPLICATIONS

This application is based upon and claims the benefit of priority from the prior Japanese Patent Application No. 2019-020729, filed on Feb. 7, 2019, the entire contents of which are incorporated herein by reference.

FIELD

The embodiment of the present invention relate to high-frequency amplifier circuitry and a semiconductor device.

BACKGROUND

For Low Noise Amplifier (LNA), a SiGe bipolar process has been generally used, and the one made by a Silicon On Insulator (SOI) CMOS process becomes more frequently used in recent years. This is because a high functional circuitry can be realized by incorporating a high-frequency switch FET in the LNA. Recently, Carrier Aggregation (CA) is introduced to speed up the radio communication. The mode of CA includes an intra-band CA in which case the output of the LNA needs to be branched into two, and a single output mode and a split output mode are needed as output modes for realizing the LNA corresponding to the intra-band CA. However, about 25 dB of isolation between outputs during the split output mode is required but is not easy to realize.

BRIEF DESCRIPTION OF THE DRAWINGS

FIG. 6 is a chart illustrating a control signal in the circuitry in FIG. 5;

FIG. 11 is a table listing characteristics in the circuitry in FIG. 5;

FIG. 19 is a table listing characteristics in the circuitry in FIG. 14;

FIG. 22 is a chart illustrating a control signal in the circuitry in FIG. 21;

FIG. 27 is a table listing characteristics in the circuitry in FIG. 21;

FIG. 30 is a chart illustrating a control signal in the circuitry in FIG. 29;

FIG. 36 is a table listing characteristics in the circuitry in FIG. 29;

DETAILED DESCRIPTION

Figure 1:
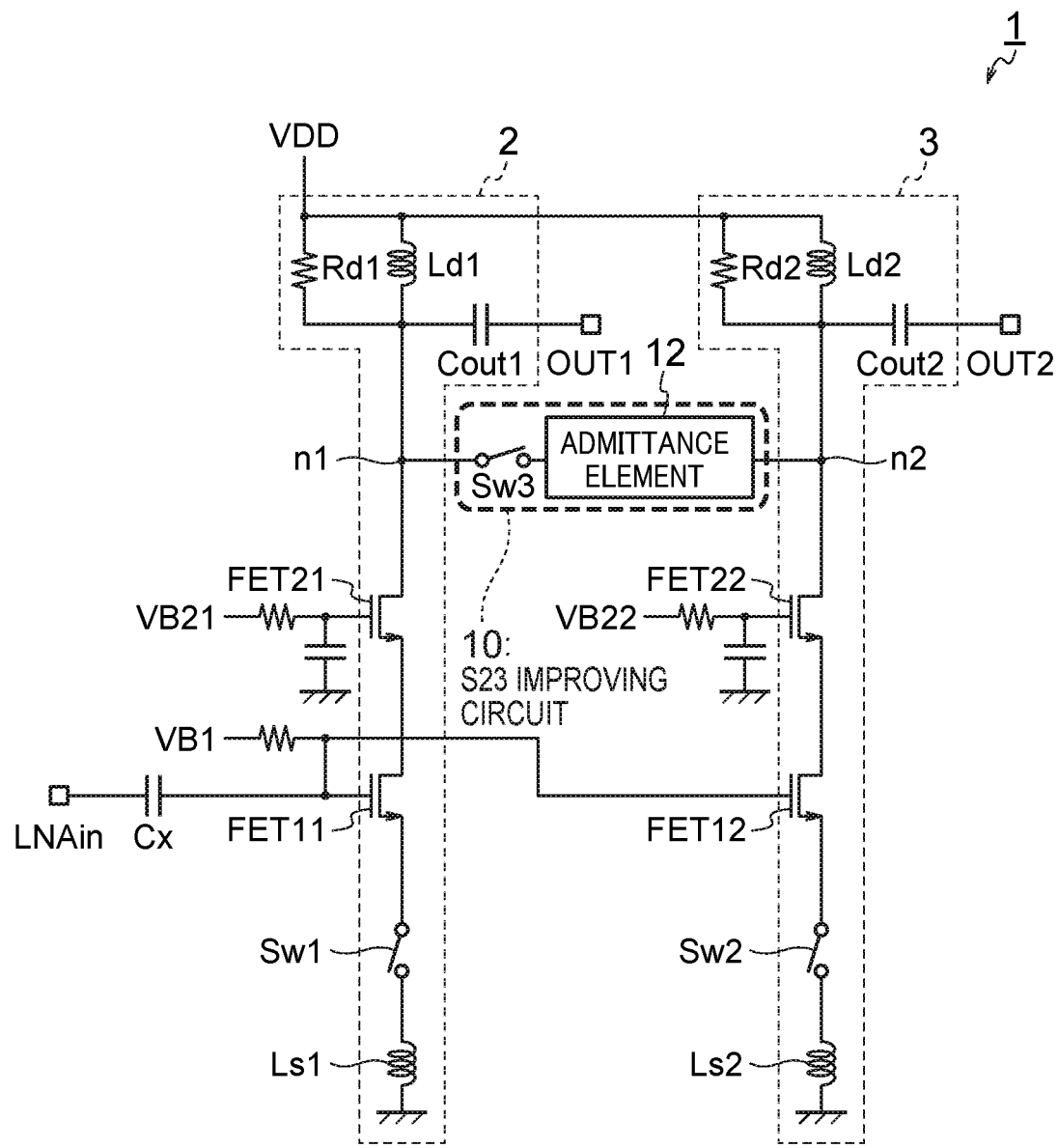
FIG. 1 is a circuitry diagram illustrating an example of an S23 improving circuitry according to an embodiment.

According to one embodiment, a high-frequency amplifier circuitry includes first amplifier circuitry, second amplifier circuitry, and noise figure improving circuitry. The first amplifier circuitry includes a first transistor and a grounded-gate third transistor which are cascode-connected. The first transistor has a source grounded via a first source inductor and a gate to which an input signal is applied. The third transistor is configured to output from a drain a signal obtained by amplifying a signal outputted from a drain of the first transistor. The second amplifier circuitry includes a same circuit constant as a circuit constant of the first amplifier circuitry and includes a second transistor and a grounded-gate fourth transistor which are cascode-connected. The second transistor has a source grounded via a second source inductor and a gate to which the input signal is applied. The fourth transistor is configured to output from a drain a signal obtained by amplifying a signal outputted from a drain of the second transistor. The noise figure improving circuitry connects the source of the first transistor and the source of the second transistor to each other. The high-frequency amplifier circuitry has a single output mode of outputting the amplified signal from one of the first amplifier circuitry and the second amplifier circuitry, and a split output mode of outputting the amplified signal from both of the first amplifier circuitry and the second amplifier circuitry.

Embodiments will now be explained with reference to the drawings. Note that though the embodiments are explained and illustrated with some components omitted, modified or simplified in this specification and the attached drawings for convenience of easy understanding and illustration, the technical contents at the level at which the same functions can be expected will be interpreted while being included in the embodiments. Further, in the drawings attached to this specification, the scale and the aspect ratio and so on are changed from the original size and exaggerated for convenience of illustration and easy understanding.

In this explanation, a switch includes, for example, an n-type MOSFET. When a voltage of a predetermined value or more is applied to the gate of the n-type MOSFET, the switch goes to on-state. The MOSFET may be of a p-type, in which case when a voltage of a predetermined value or less is applied to the gate of the p-type MOSFET, the switch goes to on-state.

First of all, two improving circuitry common in embodiments will be explained.

FIG. 1 is a circuitry diagram of a high-frequency amplifier circuitry (hereinafter, described as an LNA) including an isolation improving circuitry which improves isolation between output ports. An LNA1 in FIG. 1 can be arranged, for example, on an SOI substrate. A peripheral circuitry of the LNA1, for example, an antenna switch and the LNA1 may be arranged on the same SOI substrate. The LNA1 in FIG. 1 is used, for example, in a radio apparatus such as a cellular phone, a smartphone or the like regardless of usage and installation place.

The LNA1 includes an input port LNAin, and a first output port OUT1 and a second output port OUT2 which are two output ports. The LNA1 has a single output mode of amplifying a signal inputted from the input port LNAin and outputting the amplified signal from one of the output ports, and a split output mode of outputting the amplified signal from both of the output ports. In particular, the single output mode includes a first single output mode of outputting the signal from the first output port OUT1, and a second single output mode of outputting the signal from the second output port OUT2. In the following, the input port LNAin is described as a port 1, the first output port OUT1 is described as a port 2, and the second output port OUT2 is described as a port 3, and the isolation between the ports is designated based on the port numbers.

The LNA1 includes a first amplifier circuitry 2 including the first output port OUT1, a second amplifier circuitry 3 including the second output port OUT2, and an isolation improving circuitry 10. The first amplifier circuitry 2 includes a first transistor FET11, a third transistor FET21, a first source inductor Ls1, a first switch Sw1, a first output matching resistor Rd1, a first output matching inductor Ld1, and a first output matching capacitor Cout1.

A high-frequency signal inputted into the input port LNAin is inputted into a gate of the first transistor FET11. From the first output port OUT1 connected between a power supply voltage VDD and a drain of the third transistor FET21, the inputted high-frequency signal is outputted after being amplified. More specifically, the signal is outputted after being amplified and matched by the first source inductor Ls1, the first transistor FET11, the third transistor FET21, the first output matching resistor Rd1 for output matching, the first output matching inductor Ld1, and the first output matching capacitor Cout1. This operation is equal to the operation of the LNA by a cascode-connected amplifier circuitry in which general grounded-source FET and grounded-gate FET are connected, and therefore a detailed explanation of the operation will be omitted.

Note that each output matching circuitry element is illustrated as an example, and is not an essential point in the embodiments explained below. In other words, the output matching circuitry element may have another configuration and may be provided outside the first amplifier circuitry 2, in a broad sense, outside the LNA1.

Similarly, the second amplifier circuitry 3 includes a second transistor FET12, a fourth transistor FET22, a second source inductor Ls2, a second output matching resistor Rd2, a second output matching inductor Ld2, and a second output matching capacitor Cout2, and outputs the high-frequency signal inputted into the input terminal LNAin, from the second output port OUT2, after amplifying the signal.

In the amplifier circuitry, in the case of the split output mode, the first switch Sw1 and a second switch Sw2 are turned on to cause both the amplifier circuitry to connect to the source inductors and perform the operation of outputting the signal after amplifying the signal. On the other hand, in the case of the single output mode, for example, in the case of outputting the amplified signal only from the first amplifier circuitry, the first switch Sw1 is turned on and the second switch Sw2 is turned off. As a result of this, the first amplifier circuitry amplifies the signal and outputs the amplified signal from the port 2, whereas the second amplifier circuitry 3 does not perform the amplification itself of the signal. The bias voltage applied to the gates of the third transistor FET21 and the fourth transistor FET22 whose gates are grounded in a high-frequency manner may be similarly controlled. As explained above, in the single output mode, the on-off states of the switch and the transistor may be switched corresponding to the port for outputting. The states of the transistors and switches will be explained in detail in later-explained embodiments.

The isolation improving circuitry 10 is a circuitry which improves the isolation between the port 2 and the port 3. The isolation improving circuitry 10 includes a third switch Sw3 and an admittance element 12. In the following, the isolation improving circuitry is described also as an S23 improving circuitry. The isolation improving circuitry 10 connects the drain of the third transistor FET21 and the drain of the fourth transistor FET22.

More specifically, the S23 improving circuitry 10 is provided between the transistor which amplifies the signal and the output port (output matching circuitry) to connect the ports. More specifically, as illustrated in the drawing, the S23 improving circuitry 10 connects a node n1 between the third transistor FET21 and the first output matching inductor Ld1 and a node n2 between the fourth transistor FET22 and the second output matching inductor Ld2.

The third switch Sw3 is a switch which is controlled, for example, to be turned on in the split output mode and to be turned off in the single output mode. As explained above, the third switch Sw3 shifts the connection state of the S23 improving circuitry 10 based on the output mode.

Here, a Y21 component of a Y parameter, when an input of an input matching circuit connected to LNAin is terminated in 50Ω, a circuitry obtained by eliminating the output matching capacitors Cout1, Cout2 and the S23 improving circuitry 10 is regarded as a virtual circuitry A, and the node n1 is the first port and the node n2 is the second port in the virtual circuitry A, is assumed as Y21(A). Further, the Y21 component of the Y parameter, when one terminal of the admittance element 12 is the first port and the other terminal is the second port, is assumed as Y21(B).

In this embodiment, the setting is made so that Y21(B)=−Y21(A). More specifically, the admittance element 12 cancels the admittance between the node n1 and the node n2 in the split output mode. This improves the S23 of the LNA1. Simply, the admittance element 12 includes, for example, a resistor and a capacitor connected in series.

Provision of the S23 improving circuitry 10 improves the isolation between the first output terminal OUT1 and the second output terminal OUT2 in the split output mode.

Figure 2:
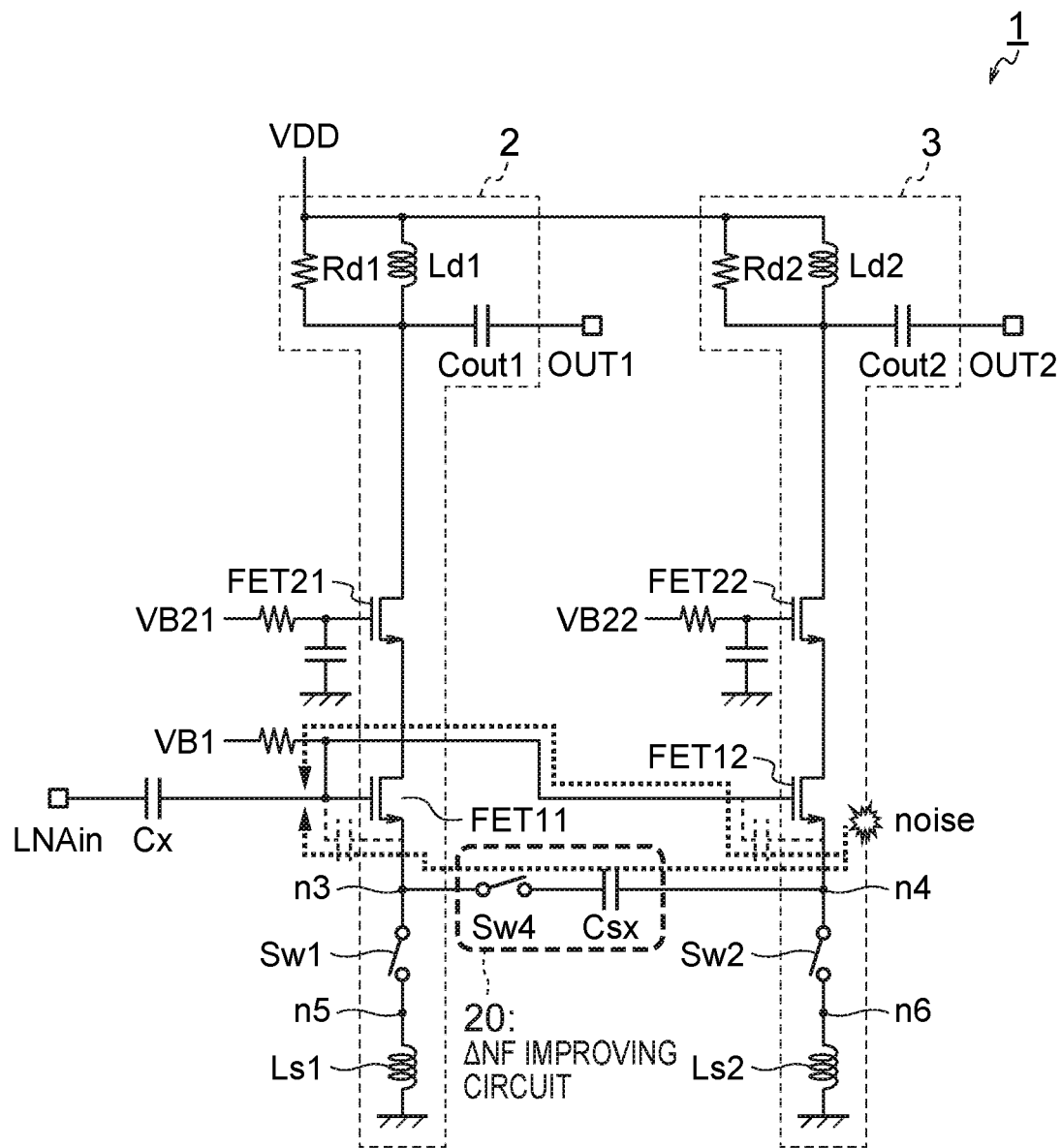
FIG. 2 is a circuitry diagram illustrating an example of a ΔNF improving circuitry according to an embodiment.

FIG. 2 is a circuitry diagram of an LNA including a noise figure improving circuitry which reduces the noise during the split output mode. Similarly to the above LNA1, the LNA can be arranged, for example, an SOI substrate.

In the LNA1 in FIG. 2, the configurations of the above-explained first amplifier circuitry 2 and second amplifier circuitry 3 are the same. On the other hand, in place of the isolation improving circuitry, a noise figure improving circuitry 20 is provided. The noise figure improving circuitry 20 is a circuitry which suppresses, in the first amplifier circuitry 2 and the second amplifier circuitry 3, the noise from the other amplifier circuitry. In the following, the noise figure improving circuitry is described also as a ΔNF improving circuitry. The ΔNF improving circuitry 20 connects a node n3 between the first transistor FET11 and the first switch Sw1 and a node n4 between the second transistor FET12 and the second switch Sw2.

The ΔNF is a value expressed as (NF during the split output)−(NF during the single output), and expresses the difference in noise figure (NF) between the modes during the split output and during the single output. The ΔNF improving circuitry 20 is a circuitry which is turned on in the case of the split output so as to suppress the noise of the output during the split output to a noise level of the output during the single output.

The ΔNF improving circuitry 20 includes a fourth switch Sw4 and a capacitor Csx. The fourth switch Sw4 is turned off during the single output mode to bring the ΔNF improving circuitry into a state of not being connected to the amplifier circuitry. On the other hand, in the case of the split output mode, the fourth switch Sw4 is turned on to connect the capacitor Csx between the source of the first transistor FET11 and the source of the second transistor FET12.

For explaining the role of the capacitor Csx, the appearance in which the noise generated in the channel of the second transistor FET12 goes around to the gate of the first transistor FET11 will be explained. The current noise generated in the channel of the second transistor FET12 induces a noise voltage at the node n4. The noise voltage goes around to the gate of the first transistor FET11 via the capacitance between the gate and source of the second transistor FET12. On the other hand, the noise voltage goes around to the gate of the first transistor FET11 also via the capacitor Csx and the capacitance between the gate and source of the first transistor FET11. Therefore, if the phase difference between transmission paths of both of them is adjusted to be 180°, the noise generated in the channel of the second transistor FET12 never goes around to the gate of the first transistor FET11. Similarly, the noise generated in the channel of the first transistor FET11 never goes around to the gate of the second transistor FET12.

In this embodiment, the capacitor Csx is adjusted as explained above. Specifically, the capacitor Csx is adjusted so that the ΔNF becomes smallest near the center of the frequency band being the amplification target of the LNA1.

For example, a broken line illustrated in the drawing is a parasitic capacitance between the source and the gate in each transistor. When noise is generated in the second transistor FET12, the noise is transmitted to the gates of the first transistor FET11 and the second transistor FET12 via a parasitic capacitance of the second transistor FET12. When the ΔNF improving circuitry 20 is not provided, the noise is added to the input signal and applied to the gate of the first transistor FET11.

Hence, the ΔNF improving circuitry 20 generates a signal which is obtained by shifting the phase of the noise by 180° and is to be fed back to the gate of the first transistor FET11 via the parasitic capacitance between the source and the gate of the first transistor FET11, and cancels the noise. Similarly, also when the noise is generated in the first transistor FET11, the ΔNF improving circuitry cancels the noise applied to the gates of the first transistor FET11 and the second transistor FET12.

Figure 3:
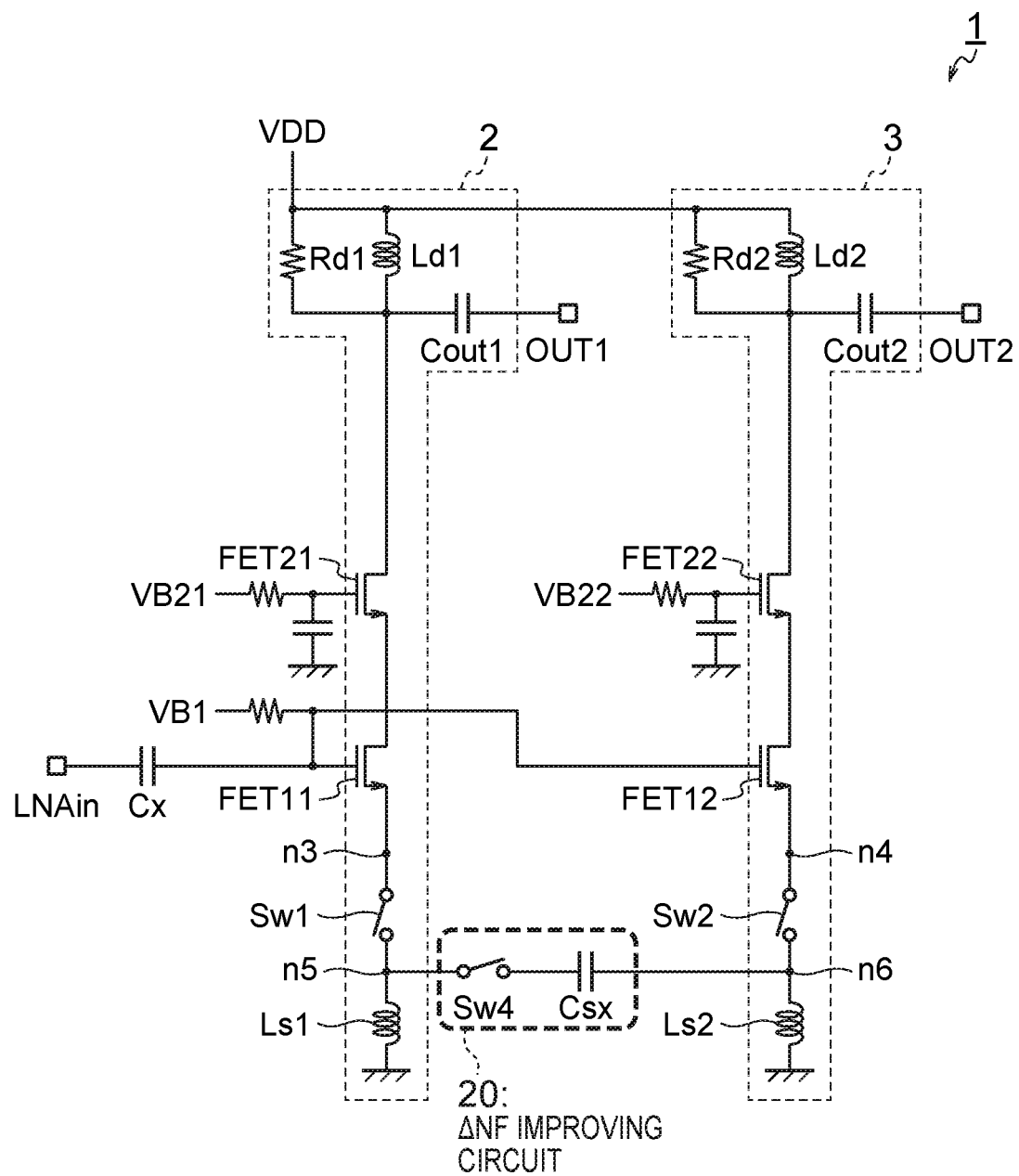
FIG. 3 is a circuitry diagram illustrating an example of a ΔNF improving circuitry according to an embodiment.

FIG. 3 illustrates another arrangement example of the ΔNF improving circuitry 20. As illustrated in FIG. 3, the ΔNF improving circuitry may be provided to connect a node n5 between the first switch Sw1 and the first source inductor Ls1 to a node n6 between the second switch Sw2 and the second source inductor Ls2.

If the ΔNF improving capacitor Csx gives favorable effects in the single output mode, the fourth switch Sw4 can be eliminated from the ΔNF improving circuitry. In this case, the ΔNF improving circuitry consists of only the ΔNF improving capacitor Csx.

Note that the transistors for amplifying the signal in the amplifier circuitry are configured at two stages in the above, but may be configured at three stages. For example, the first amplifier circuitry may include a fifth transistor having a gate grounded in a high-frequency manner in addition to the first transistor FET11 and the third transistor FET21. The fifth transistor is provided between the third transistor FET21 and the port 2 in series so that its source is connected to the drain of the third transistor FET21.

Figure 4:
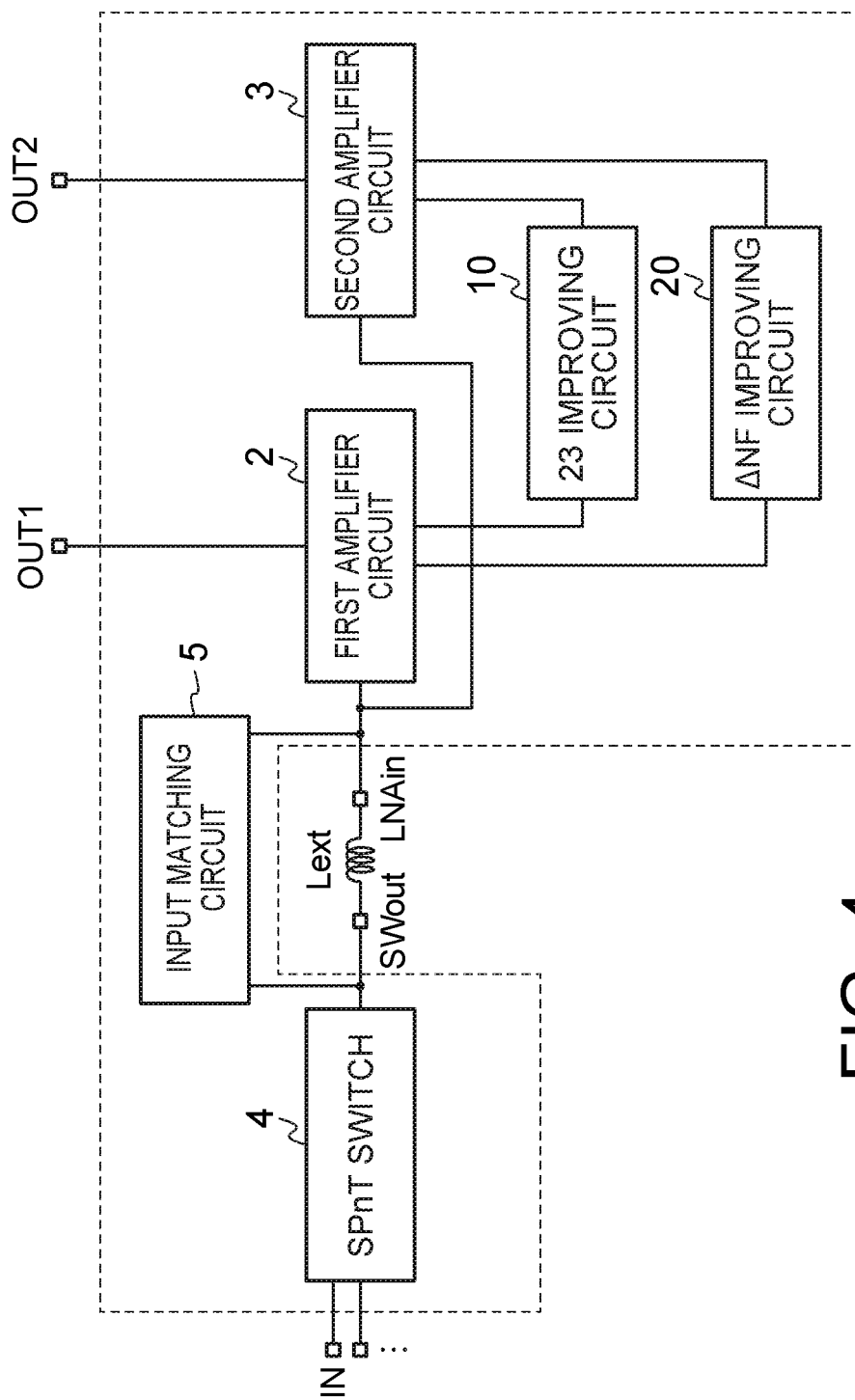
FIG. 4 is a block diagram illustrating an example of an LNA according to an embodiment.

FIG. 4 is a concrete installation example of the LNA1. The LNA1 further includes, for example, an SPnT switch 4 and an input matching circuitry 5 in addition to the first amplifier circuitry 2, the second amplifier circuitry 3, the S23 improving circuitry 10, and the ΔNF improving circuitry 20.

The SPnT switch 4 (Single-Pole n-Throw Switch) is a band select switch which selects the signal to be amplified from among n input signals IN corresponding to n bands. For example, when either a Band7 (2620 MHz to 2690 MHz) or a Band41 (2496 MHz to 2690 MHz) is selected and amplified, an SPDT (Single-Pole Double-Throw) switch is provided at a stage preceding to the amplifier circuitry designed for the Band41 because the Band7 is included in the Band41.

To the LNA1 explained below, the signal of the frequency belonging to the frequency band of the Band41 is selected and outputted. The LNA1 may include amplifier circuitry corresponding to many frequency bands other than the first amplifier circuitry 2 and the second amplifier circuitry 3, and may output the signal from the SPnT switch 4 to an amplifier circuitry outside the LNA1. In this case, a plurality of LNAs and so on may be provided on the same SOI substrate as that of the SPnT switch 4.

The signal outputted from the SPnT switch 4 is outputted once from a terminal SWout to the external part, and is inputted via an external inductor Lext as an input signal from the input port LNAin. The input matching circuitry 5 may be provided in parallel with the external inductor Lext in the LNA1.

The inputted signal is amplified in the first amplifier circuitry 2 and the second amplifier circuitry 3 provided in parallel as explained above, and outputted in the mode of the single output or the split output. The isolation characteristics or the noise characteristics between the output ports are improved via the S23 improving circuitry 10 and the ΔNF improving circuitry 20 at least one of which is provided between the two amplifier circuitry.

Note that though not illustrated in FIG. 4, each block is connected to the power supply voltages Vdd, Vss (or GND) as necessary and thereby supplied with required power. Further, to each transistor in the circuitry, the bias voltage is applied to its gate from the external part as required (for example, according to the output mode). The LNA1 may be provided with an input terminal which accepts input of the power supply voltage, the bias voltage or the like. Further, in the case of applying the bias voltage t the gate, a resistor, a grounded capacitor and so on which suppress the high-frequency noise may be provided according to the need.

Hereinafter, these circuitry will be explained by illustrating more concrete embodiments.

First Embodiment

Figure 5:
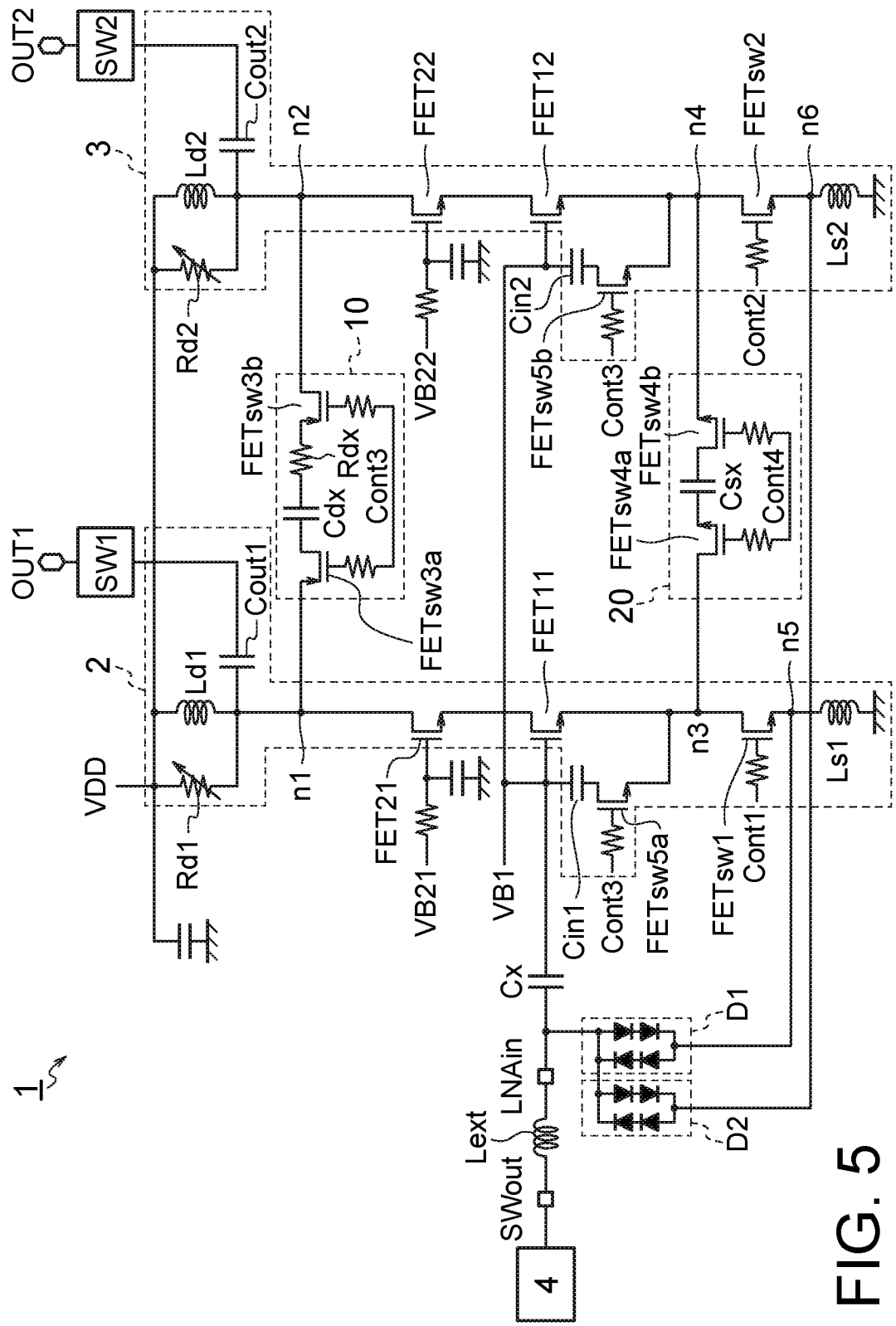
FIG. 5 is a circuitry diagram illustrating an example of an LNA according to an embodiment.

FIG. 5 is a diagram illustrating an example of an LNA1 according to this embodiment. In the following embodiment, the frequency band of the Band41 (2496 MHz to 2690 MHz) will be explained as an example, but is not limited to this. For example, for other frequency bands, the performance is improved by the similar circuitry configuration through the use of a circuitry element in which the circuit constants are changed.

The first amplifier circuitry 2 and the second amplifier circuitry 3 are basically the same as the above-explained ones. The first amplifier circuitry 2 further includes a fifth switch FETsw5a which is turned on in the first single output mode, and a capacitor Cin1 whose connection state is controlled by the fifth switch FETsw5a. Similarly, the second amplifier circuitry 3 further includes a sixth switch FETsw5b and a capacitor Cin2. These capacitors operate as matching circuitry on the input side. More specifically, because the single output mode changes in impedance as compared with the split output mode, these capacitors are provided for matching the impedances in both the output modes.

A first output matching resistor Rd1 and a second output matching resistor Rd2 may be variable resistors as illustrated in the drawing so as to perform a gain adjustment. Further, a first output switch SW1 and a second output switch SW2 each of which decides whether to output a signal from the output port according to each output mode may be provided. More specifically, the first output switch SW1 which is turned on in the first single output mode and the split output mode and turned off in the second single output mode and the second output switch SW2 which is turned on in the second single output mode and the split output mode and turned off in the first single output mode, may be provided.

The LNA1 includes an S23 improving circuitry 10 and a ΔNF improving circuitry 20 which connect the first amplifier circuitry 2 and the second amplifier circuitry 3.

The S23 improving circuitry 10 includes third switches FETsw3a, FETsw3b on the sides of the respective amplifier circuitrys. Between the switches, a resistor Rdx and a capacitor Cdx connected in series as an admittance element 12 are provided. The resistor Rdx and the capacitor Cdx are adjusted to have a value canceling the admittance between a node n1 and a node n2 as explained above.

Gates of the third switches FETsw3a, FETsw3b may be connected to each other. To these switches, signals are inputted to the gates so that the switches are turned on in the split output mode and turned off in the first single output mode and the second single output mode. For example, the third switches FETsw3a, FETsw3b include p-type MOSFETs.

The ΔNF improving circuitry 20 is connected between the nodes n3 and n4, and includes fourth switches FETsw4a, FETsw4b on the sides of the respective amplifier circuitry. Between the switches, a ΔNF improving capacitor Csx (noise figure improving element) is provided. A value of the ΔNF improving capacitor Csx is adjusted so that the phase of the noise transmitted from the second transistor FET12 to the first transistor FET11 is shifted by 180° (inverted) near the middle of the frequency band, for example, near the middle of the frequency band of the Band41 as explained above.

Gates of the fourth switches FETsw4a, FETsw4b (noise figure improving circuitry first/second changeover switches) may be connected to each other. To these switches, signals are inputted to the gates so that the switches are turned on in the split output mode and turned off in the first single output mode and the second single output mode. For example, the fourth switches FETsw4a, FETsw4b include n-type MOSFETs.

The LNA1 further includes electrostatic discharge protection circuitry (hereinafter, described as ESD protection circuitry) D1, D2 connected between a node n5 of the first amplifier circuitry 2 and an input port LNAin, and between a node n6 of the second amplifier circuitry 3 and the input port LNAin, respectively. The ESD protection circuitry D1, D2 are circuitry each of which protects the amplifier circuitry from ESD on the input side. The ESD protection circuitry D1, D2 are configured, for example, such that PN junction diodes are arranged in parallel and in opposite directions as illustrated in the drawing. The conventional ESD protection circuitry is provided between the input port LNAin and the ground potential, but the connection as in FIG. 5 makes the parasitic capacitance of the ESD protection circuitry D1 a part of the input matching circuitry of the first amplifier circuitry and makes the parasitic capacitance of the ESD protection circuitry D2 a part of the input matching circuitry of the second amplifier circuitry to thereby improve the input reflection characteristics.

FIG. 6 is a table listing the state of the switch or the voltage to be applied in each mode in the circuitry in FIG. 5. The output mode indicates the single output mode and the split output mode. The active output indicates the port from which the signal is outputted. The output port OUT1 is the active output in the first single output mode, the output port OUT2 is the active output in the second single output mode, and the output ports OUT1, OUT2 are the active output in the split output mode.

VB21, VB22 are bias voltages applied to the gate of the third transistor FET21 and the gate of the fourth transistor FET22, respectively. The Cont1, Cont2, Cont3, and Cont4 are a signal for operating the first single output mode and operating the split output mode, a signal for operating the second single output mode and operating the split output mode, a signal for operating one of the single output modes, and a signal for operating the split output mode, respectively.

The first output matching resistor Rd1 and the second output matching resistor Rd2 are variable resistors for adjusting the gain of the signal outputted from each output port. Their resistance values are listed in the row of Rd1, Rd2. SW1, SW2 indicate the on/off states of the first output switch SW1 and the second output switch SW2, respectively.

As illustrated in FIG. 6, when the signal is inputted to each switch or the like, the modes such as the first single output mode, the second single output mode, and the split output mode are changed in the LNA1 in FIG. 5.

For example, as illustrated in FIG. 6, in the case of the first single output mode, namely, in the case where the output mode is the single output and the active output is OUT1, the VB21 is turned on to turn on the third transistor FET21, the Cont1 is brought to High to turn on the first switch FETsw1, and the Cont3 is brought to High to turn on the fifth switch FETsw5a and turn on the SW1.

In this case, the inputted signal is inputted, after being biased with the bias voltage VB1, into the gate of the first transistor FET11 via the capacitor Cx, and the first switch Sw1 is turned on to ground the first transistor FET11 via the first source inductor Ls1. The capacitor Cx and the first source inductor function as the input matching circuitry. The capacitor Cx also has a function of removing the direct-current component of the signal. The fifth switch FETsw5a is turned on, whereby the capacitor is connected between the gate and the source. The drain of the first transistor FET11 is connected to the source of the third transistor FET21, and the signal is outputted from the first output port OUT1 via the first output matching capacitor circuitry.

On the other hand, when the bias voltage VB22 is turned off, the fourth transistor FET22 of the second amplifier circuitry is turned off. Similarly, when the Cont2 is brought to Low, the second switch FETsw2 is turned off. When the Cont3 is brought to High, the third switches FETsw3a, FETsw3b are turned off, so that the S23 improving circuitry 10 does not operate. Similarly, when the Cont4 is brought to Low, the ΔNF improving circuitry 20 does not operate. As explained above, the amplified signal is outputted from the output port OUT1.

In this case, making the first output matching resistor Rd1 small to suppress the gain in the single output mode and suppress the gain difference with respect to the split output mode. The same operation is performed also for the second single output mode of outputting the signal only from the second amplifier circuitry 3.

In the case of the split output mode, both the VB21 and VB22 are turned on, both the Cont1 and Cont2 are brought to High, and both the SW1 and SW2 are turned on, whereby all of the third transistor FET21, the fourth transistor FET22, the first switch FETsw1, and the second switch FETsw2 are turned on. Therefore, both the first amplifier circuitry 2 and the second amplifier circuitry 3 are connected to the output ports, and the signal is outputted from each of the output ports.

Further, when the Cont3 is brought to Low, the capacitors Cin1, Cin2 are brought into a state of not operating, and both the third switches FETsw3a, FETsw3b are turned on, whereby the S23 improving circuitry 10 connects the first amplifier circuitry 2 and the second amplifier circuitry 3 between the nodes n1 and n2. Further, when the Cont4 is brought to High, both the fourth switches FETsw4a, FETsw4b are turned on, whereby the ΔNF improving circuitry 20 connects the first amplifier circuitry 2 and the second amplifier circuitry 3 between the nodes n3 and n4.

As explained above, inputting the control signal as in FIG. 6 makes it possible to switch among three output modes such as the single output modes and the split output mode. Further, in the split output mode, both circuitry such as the S23 improving circuitry 10 and the ΔNF improving circuitry 20 are brought into the active state.

Hereinafter, the simulation result about the parameter and so on indicating the input/output characteristics during the single output mode and during the split output mode in this embodiment will be explained. For example, the power supply voltage was set to 1.8 V and the frequency range as a target was set to the Band41. In the following drawings, regarding the graph of the S parameter, m1 indicates observation at a frequency of 2496 MHz, m2 indicates observation at a frequency of 2593 MHz, and m3 indicates observation at a frequency of 2690 MHz. Besides, regarding the graph of the NF, m4 indicates observation at a frequency of 2496 MHz, m5 indicates observation at a frequency of 2593 MHz, and m6 indicates observation at a frequency of 2690 MHz.

Figure 7:
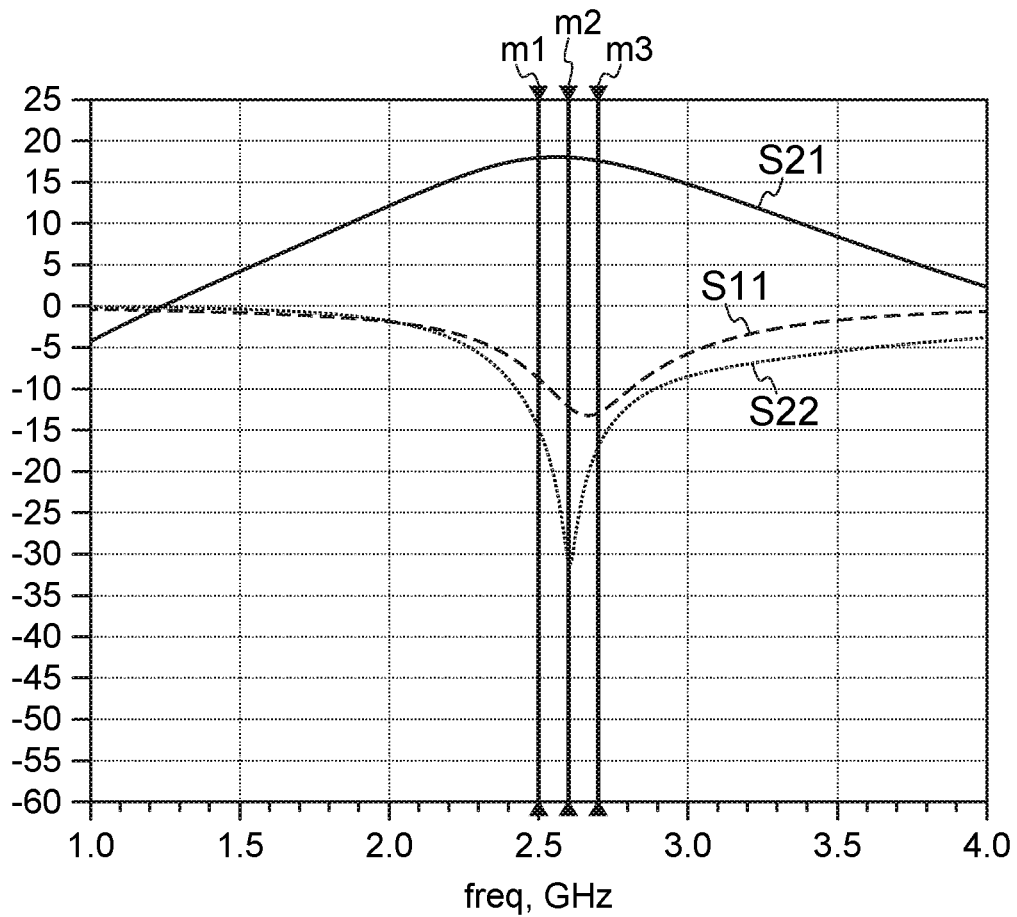
FIG. 7 is a chart illustrating an S parameter in a single output mode of the circuitry in FIG. 5.

FIG. 7 is a chart illustrating the S parameter (Scattering Parameter) being input/output characteristics during the single output mode by the LNA1 according to this embodiment. For easy description, with the input port regarded as the port 1 and the output port regarded as the port 2 or the port 3, each S parameter is expressed as S21 or the like. A solid line indicates S21, a broken line indicates S11, and a dotted line indicates S22.

The degree of amplification of the output signal with respect to the input signal can be represented by S21. A larger S21 indicates a higher gain in a focused frequency range (Band41). The degree of reflection (reflection property) on the port on the input side with respect to the input signal is represented by S11, and is desired to be low (for example, −10 dB or lower) because impedance match is required in principle at the input/output port in the high-frequency circuitry.

As illustrated in the chart, it is found that the curve of S21 indicates a high value in the focused frequency range. On the other hand, it is found that curves of S11 and S22 are kept low in the focused frequency range.

Numerical values at the upper part in the chart represent numerical values of parameters at observation points. The gain in the single output mode is 18 dB. Further, S11 satisfies the value (−8 dB or less) generally required within the range. S22 also satisfies the value (−12 dB or less) generally required within the range.

Figure 8:
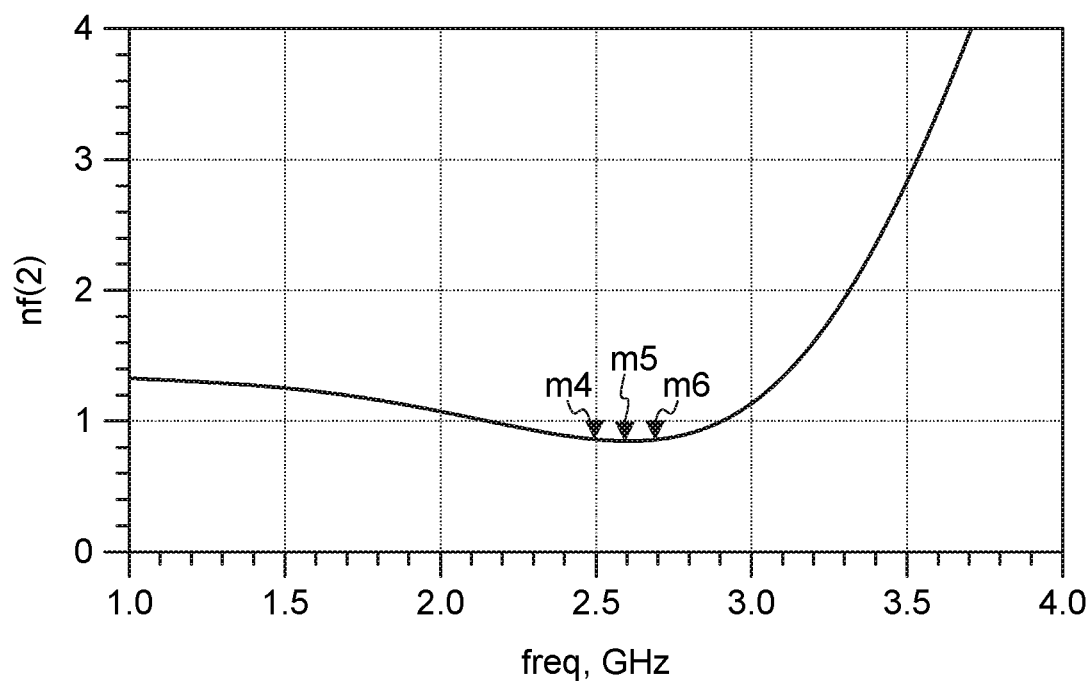
FIG. 8 is a chart illustrating an NF in the single output mode of the circuitry in FIG. 5.

FIG. 8 is a chart illustrating the NF during the single output mode by the LNA1 according to this embodiment. The NF indicates excellent characteristics at the level not exceeding 0.86 dB in the observed frequency band.

Figure 9:
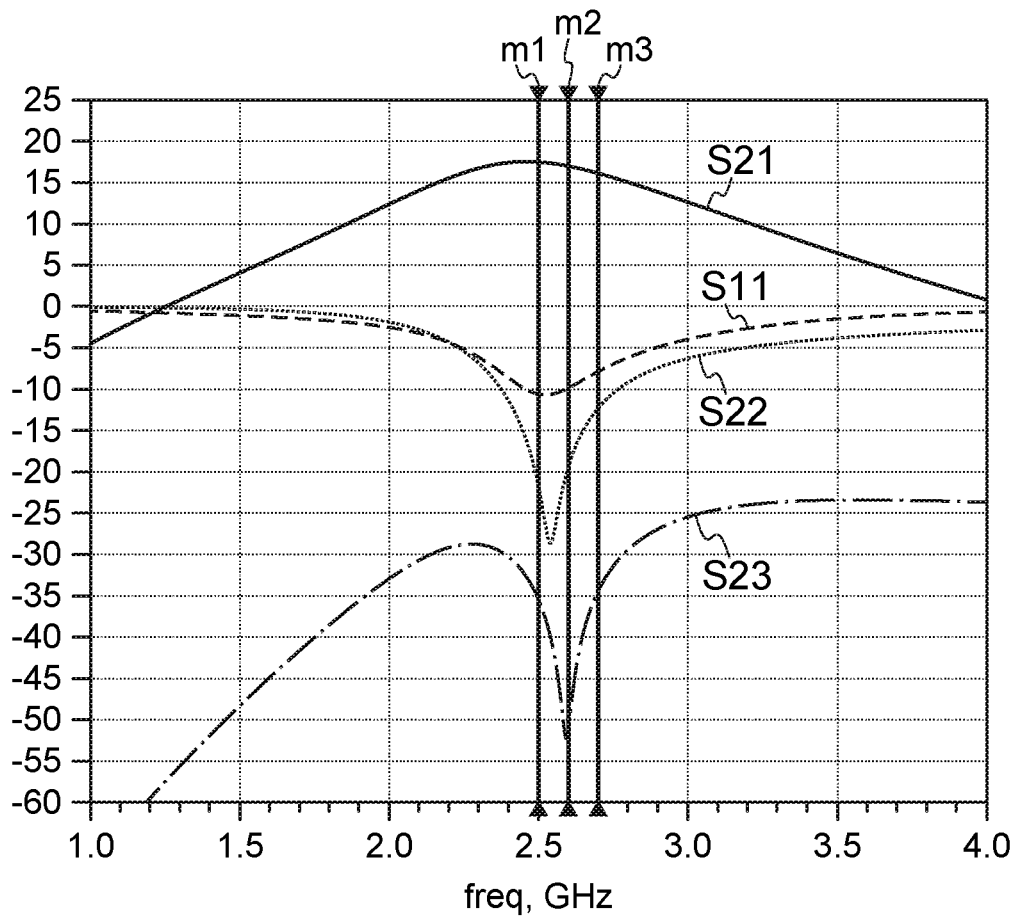
FIG. 9 is a chart illustrating the S parameter in a split output mode of the circuitry in FIG. 5.

FIG. 9 is a chart illustrating the S parameter during the split output mode by the LNA1 according to this embodiment. A one-dotted chain line indicates S23. The degree of amplification of the output signal with respect to the input signal can be represented by S21 as explained above. As in the above-explained single output mode, the reflection on the input port is S11, and the reflection on the output port is S22. Further, a problem peculiar to the split output mode is the propagation of the signal between output ports. The S parameter representing the transmission characteristics from the port 3 to the port 2 is expressed as S23. Note that though S31, S32, S33 are not illustrated, the same results as those of S21, S23, S22 can be basically obtained because the circuit constants of the first amplifier circuitry 2 and the second amplifier circuitry 3 are the same.

As is found from the chart, the curve of S21 takes a high value in the focused frequency range. It is found, on the other hand, that the curves of S11, S22, and S23 are kept low in the focused frequency range. The gain in the split output mode is 17 dB. Further, S23 is −35.1 dB which satisfies the generally required value (−25 dB or less).

S23 in the single output mode secures the isolation between the port 2 and the port 3 by the isolation of SW1 and SW2 in the off states though not clearly indicated.

Figure 10:
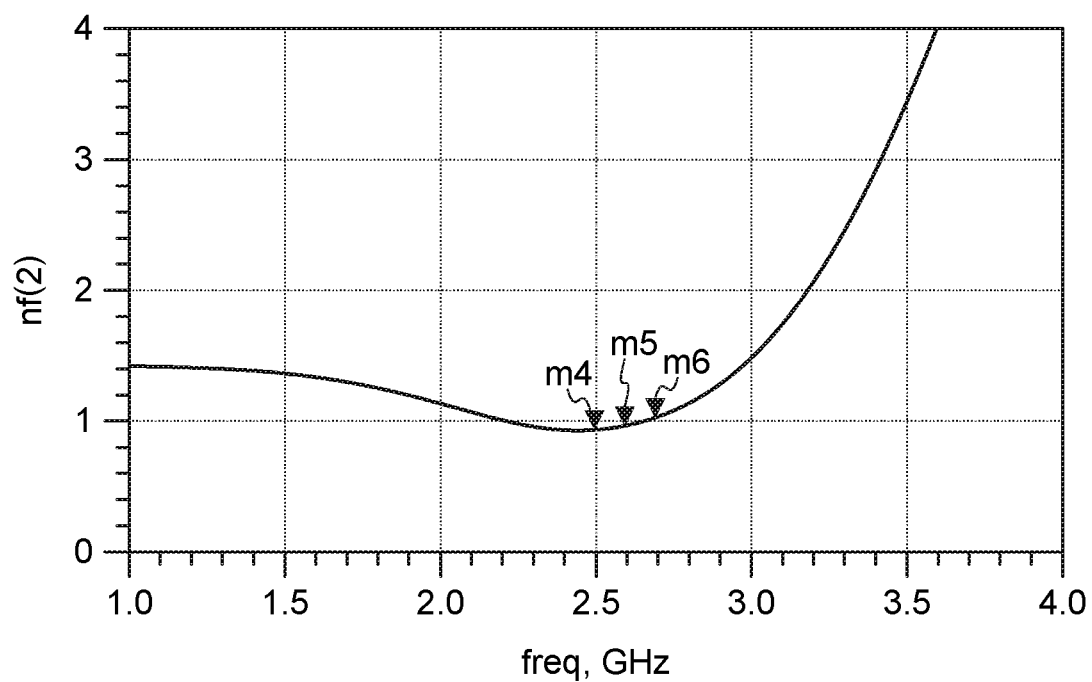
FIG. 10 is a chart illustrating the NF in the split output mode of the circuitry in FIG. 5.

FIG. 10 is a chart illustrating the noise figure during the split output mode by the LNA1 according to this embodiment. The noise figure indicates excellent characteristics at the level not exceeding 1.03 dB in the observed frequency band. It should be noted that the noise figure at the center of the range in the split output mode is deteriorated only by 0.11 dB with respect to that in the single output mode.

FIG. 11 is a table of a summary of the above-explained parameters and so on. Idd_Ina indicates the bias current inputted into the LNA1. The bias current Idd_Ina is current flowing from the VDD terminal into the LNA1 in the case where the high-frequency signal is not inputted. Generally, when the bias current is set to a large value in an appropriate range, a high gain can be obtained. In this embodiment, as an example, the bias current is 6.3 mA in the single output mode, and is 12.6 mA in the split output mode.

The fcenter indicates the result in the frequency at the middle of the range, namely, at m2, m5 in the charts. A section indicated as within range describes the worst result in the range.

The effects of the S23 improving circuitry 10 and the ΔNF improving circuitry 20 will be explained while illustrating a comparative example. In each of the following examples, results in the split output mode are indicated.

Figure 12:
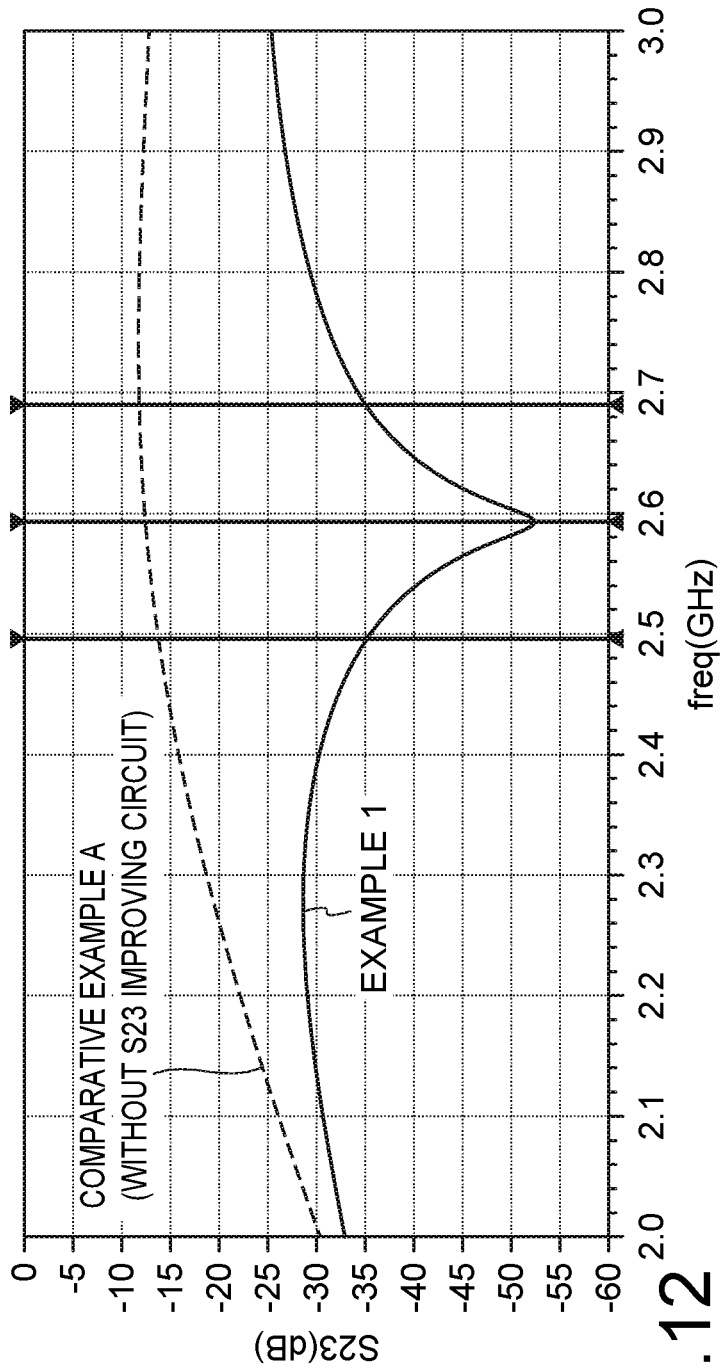
FIG. 12 is a graph illustrating characteristics in the case where the S23 improving circuitry is not provided in the circuitry in FIG. 5.

FIG. 12 is a graph illustrating transmission characteristics between the port 2 and the port 3 about the LNA in the case where the S23 improving circuitry 10 is not provided and the LNA1 according to this embodiment. It is found that in the target frequency band, the LNA1 according to this embodiment has a sufficiently low value of S23. As explained above, these take sufficiently lower values than the generally required value.

On the other hand, the LNA in the case where the S23 improving circuitry 10 is not provided is indicated by a broken line as Comparative Example A. As is found from the graph, Comparative Example A takes a large value as compared with this embodiment. Further, the result greatly exceeds the generally required value −25 dB. This shows that the S23 improving circuitry 10 provides an effect of improving the isolation between the outputs.

Figure 13:
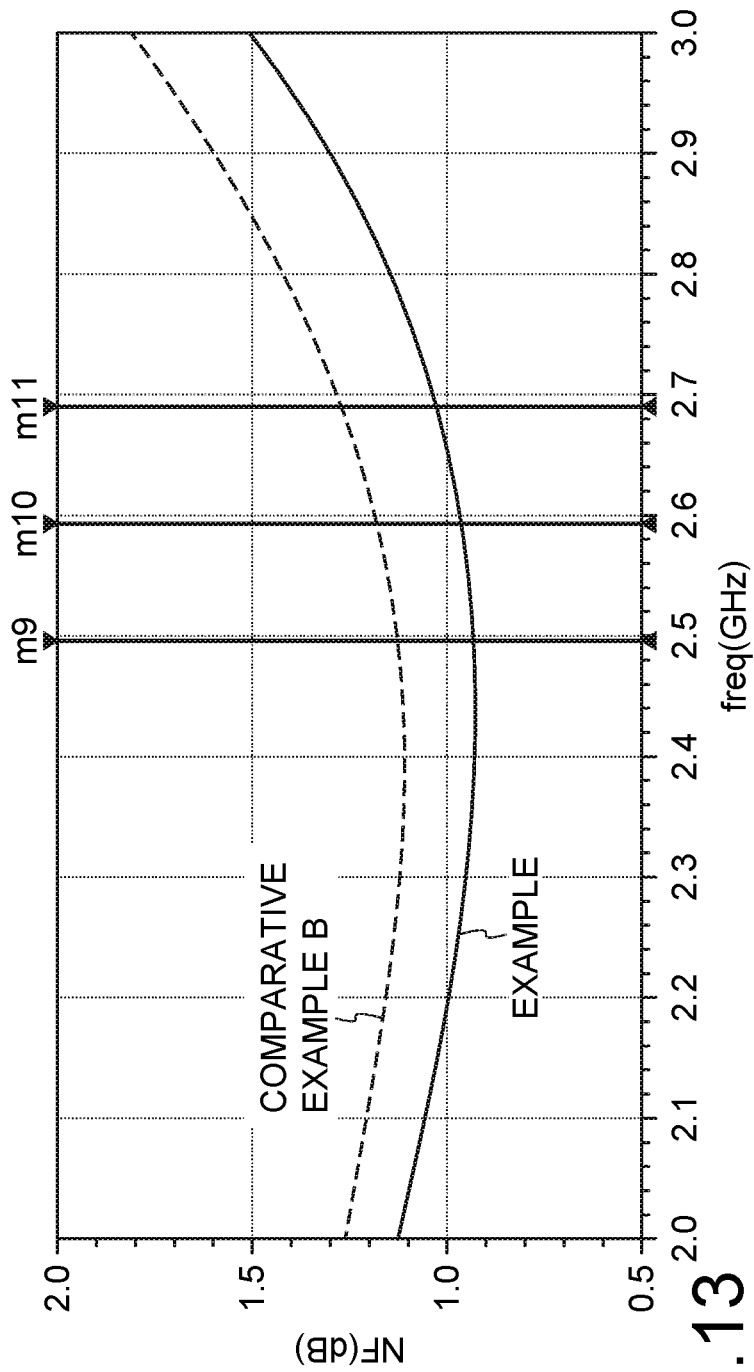
FIG. 13 is a graph illustrating characteristics in the case where the ΔNF improving circuitry is not provided in the circuitry in FIG. 5.

FIG. 13 is a graph illustrating the NF about the LNA where the ΔNF improving circuitry 20 is not provided and the LNA1 according to this embodiment. It is found that, in the target frequency band, the LNA1 according to this embodiment has a sufficiently low value of the NF. As explained above, the LNA1 according to this embodiment has excellent noise characteristics as explained above.

On the other hand, the LNA in the case where the ΔNF improving circuitry 20 is not provided is indicated by a broken line as Comparative Example B. As is found from the graph, the LNA takes a large value as compared with that in this embodiment. This shows that the ΔNF improving circuitry 20 provides an effect of improving the noise figure.

As explained above, according to this embodiment, the LNA having the single output mode and the split output mode includes the S23 improving circuitry 10 which improves the isolation between the outputs and the ΔNF improving circuitry 20 which improves the noise characteristics and thereby can increase the isolation between the outputs and reduce the noise. Further, the amplifier circuitry and so on can be arranged on the same SOI as that for the SPnT switch 4 which functions as the band select switch, so that downsizing and reduction in power consumption can be expected. Furthermore, the LNA includes the ESD protection circuitry and thereby has resistance also about the electrostatic discharge.

Second Embodiment

Figure 14:
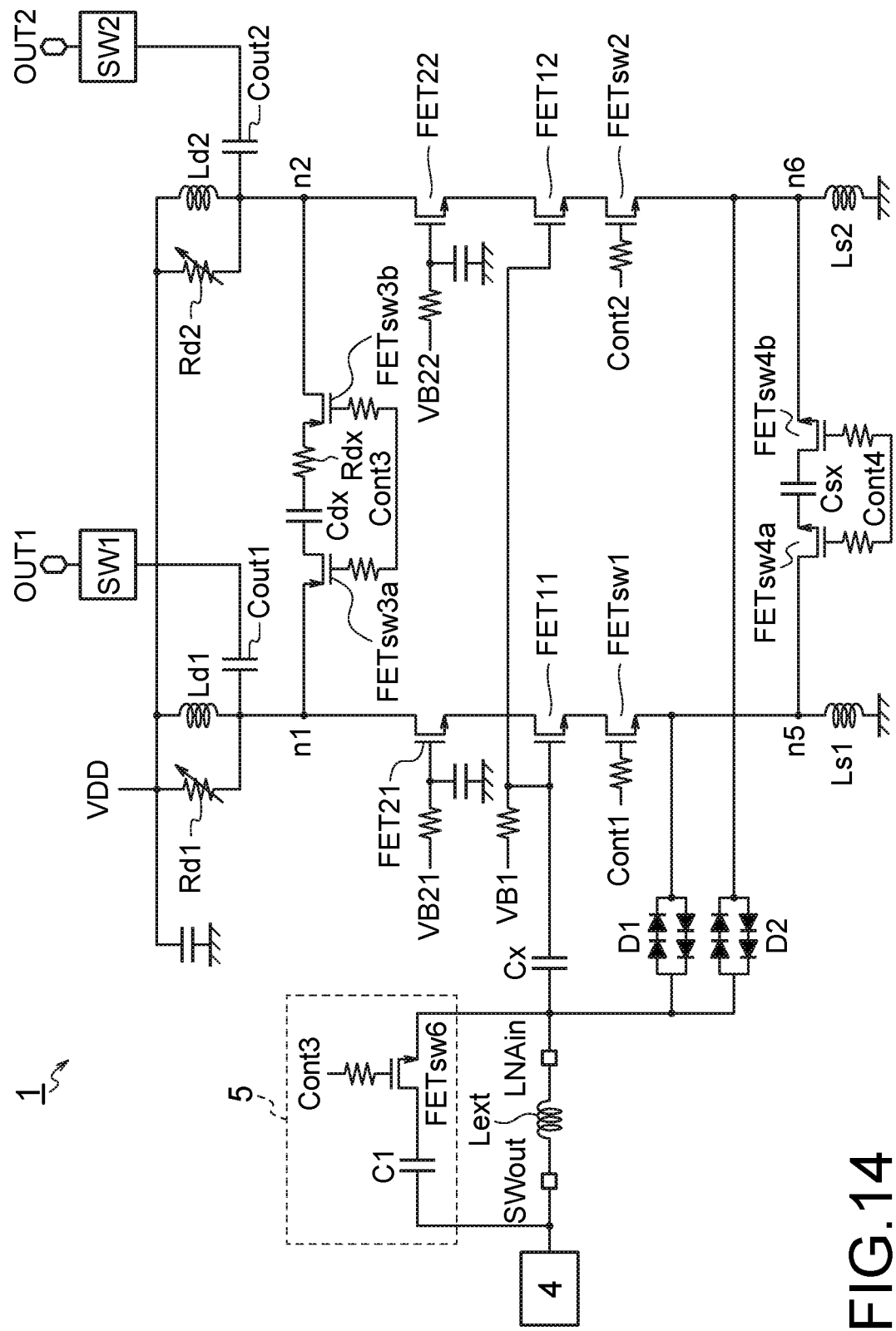
FIG. 14 is a circuitry diagram illustrating an example of an LNA according to an embodiment.

FIG. 14 is a diagram illustrating an example of an LNA1 according to this embodiment. A first amplifier circuitry 2 and a second amplifier circuitry 3 are basically the same as those in the above-explained first embodiment. An S23 improving circuitry 10 and a ΔNF improving circuitry 20 are also the same as those in the above-explained first embodiment, but the ΔNF improving circuitry 20 connects the first amplifier circuitry 2 and the second amplifier circuitry 3 between nodes n5 and n6.

Further, an input matching circuitry 5 including an input matching capacitor C1 and a seventh switch FETsw6 which are connected in series in the LNA1 is connected in parallel with an external inductor Lext. This input matching circuitry 5 is provided in place of the above-explained fifth switch FETsw5a, capacitor Cin1, sixth switch FETsw5b, and capacitor Cin2 in FIG. 5. Switching is performed so that the capacitor C1 is turned on in the single output mode and the capacitor C1 is turned off in the split output mode.

In the circuitry in FIG. 14, the state of the switch or the state of the voltage to be applied in each mode is as listed in FIG. 6 as in the first embodiment. When the Cont3 is High, namely, in the single output mode, the seventh switch FETsw6 is turned on, the capacitor C1 is connected in parallel with the external inductor Lext, and matching of the input signal is performed. When a signal is inputted to each switch or the like as illustrated in FIG. 6, the mode such as the first single output mode, the second single output mode, or the split output mode is changed in the LNA1 in FIG. 14.

Hereinafter, the simulation result about the parameter and so on indicating the input/output characteristics during the single output mode and during the split output mode in this embodiment will be explained. For example, the power supply voltage was set to 1.8 V and the frequency range as a target was set to the Band41.

Figure 15:
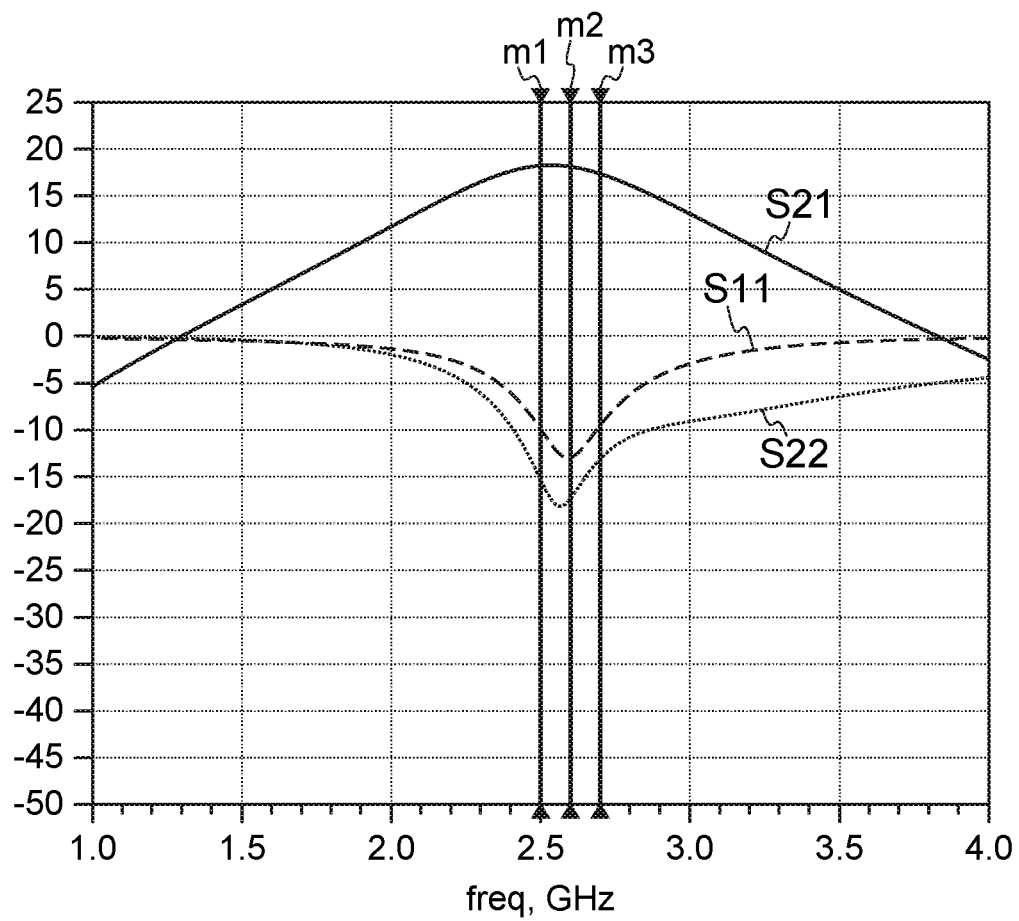
FIG. 15 is a chart illustrating an S parameter in a single output mode of the circuitry in FIG. 14.

FIG. 15 is a chart illustrating the S parameter being the input/output characteristics during the single output mode by the LNA1 according to this embodiment.

As illustrated in the chart, it is found that the curve of S21 indicates a high value in the focused frequency range. On the other hand, it is found that curves of S11 and S22 are kept low in the focused frequency range.

The gain in the single output mode is approximately 18 dB. Further, S11 satisfies the value (−8 dB or less) generally required within the range. S22 also satisfies the value (−12 dB or less) generally required within the range.

Figure 16:
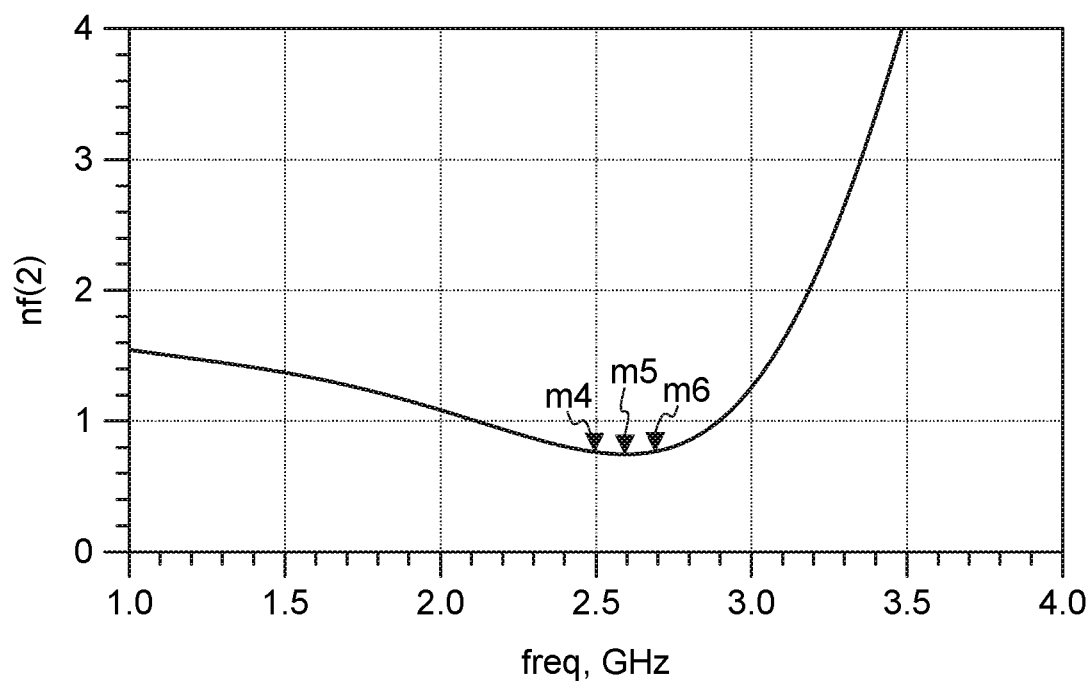
FIG. 16 is a chart illustrating an NF in the single output mode of the circuitry in FIG. 14.

FIG. 16 is a chart illustrating the NF during the single output mode by the LNA1 according to this embodiment. The NF indicates excellent characteristics at the level not exceeding 0.77 dB in the observed frequency band.

Figure 17:
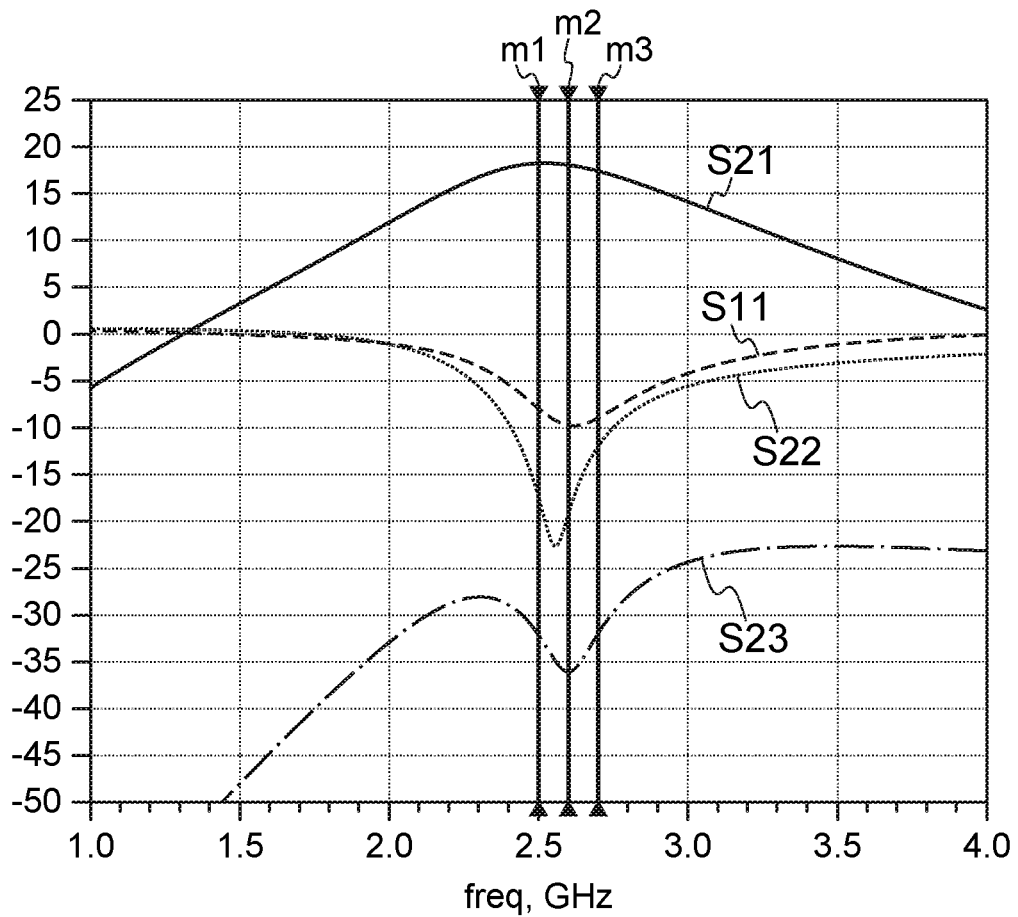
FIG. 17 is a chart illustrating the S parameter in a split output mode of the circuitry in FIG. 14.

FIG. 17 is a chart illustrating the S parameter during the split output mode by the LNA1 according to this embodiment. As is found from the chart, the curve of S21 takes a high value in the focused frequency range. It is found, on the other hand, that the curves of S11, S22, and S23 are kept low in the focused frequency range. The gain in the split output mode is approximately 17 dB. Further, S23 is −32.4 dB which satisfies the generally required value (−25 dB or less).

S23 in the single output mode secures the isolation between the port 2 and the port 3 by the isolation of SW1 and SW2 in the off states though not clearly indicated.

Figure 18:
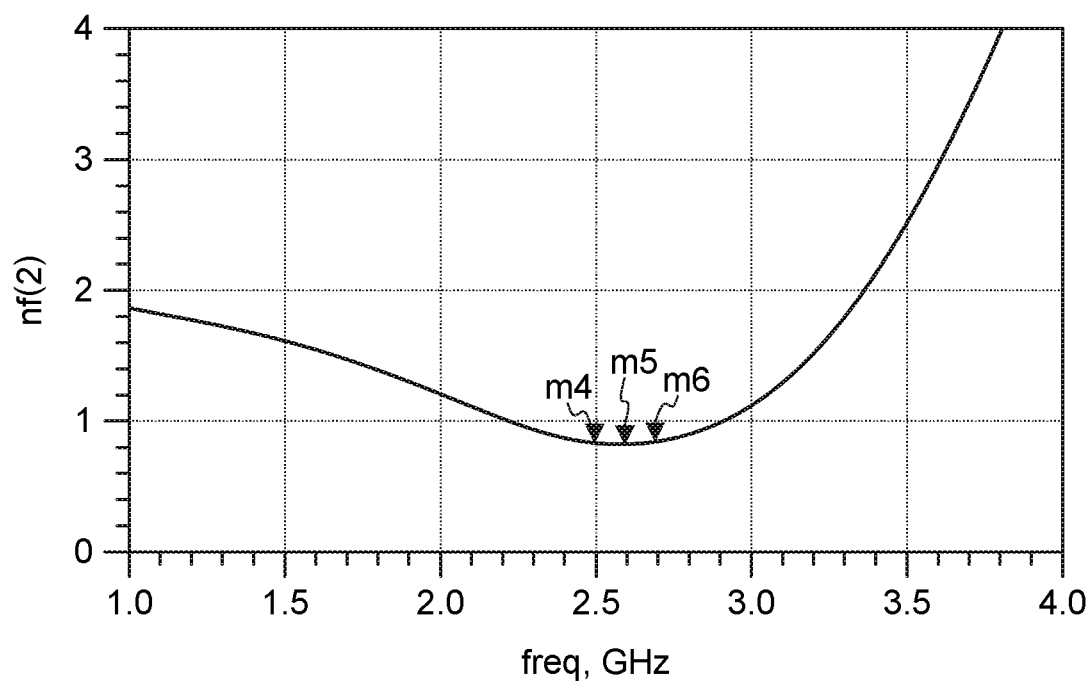
FIG. 18 is a chart illustrating the NF in the split output mode of the circuitry in FIG. 14.

FIG. 18 is a chart illustrating the noise figure during the split output mode by the LNA1 according to this embodiment. The noise figure indicates excellent characteristics at the level not exceeding 0.85 dB in the observed frequency band. It should be noted that the noise figure at the center of the range in the split output mode is deteriorated only by 0.076 dB with respect to that in the single output mode.

FIG. 19 is a table of a summary of the above-explained parameters and so on. In this embodiment, as an example, the bias current is 6.3 mA in the single output mode, and is 12.6 mA in the split output mode.

As explained above, according to this embodiment, the LNA having the single output mode and the split output mode includes the S23 improving circuitry 10 which improves the isolation between the outputs and the ΔNF improving circuitry 20 which improves the noise characteristics and thereby can increase the isolation between the outputs and reduce the noise. Further, the amplifier circuitry and so on can be arranged on the same SOI as that for the SPnT switch 4 which functions as the band select switch, so that downsizing and reduction in power consumption can be expected. Furthermore, the LNA includes the ESD protection circuitry and thereby has resistance also about the electrostatic discharge.

Figure 20:
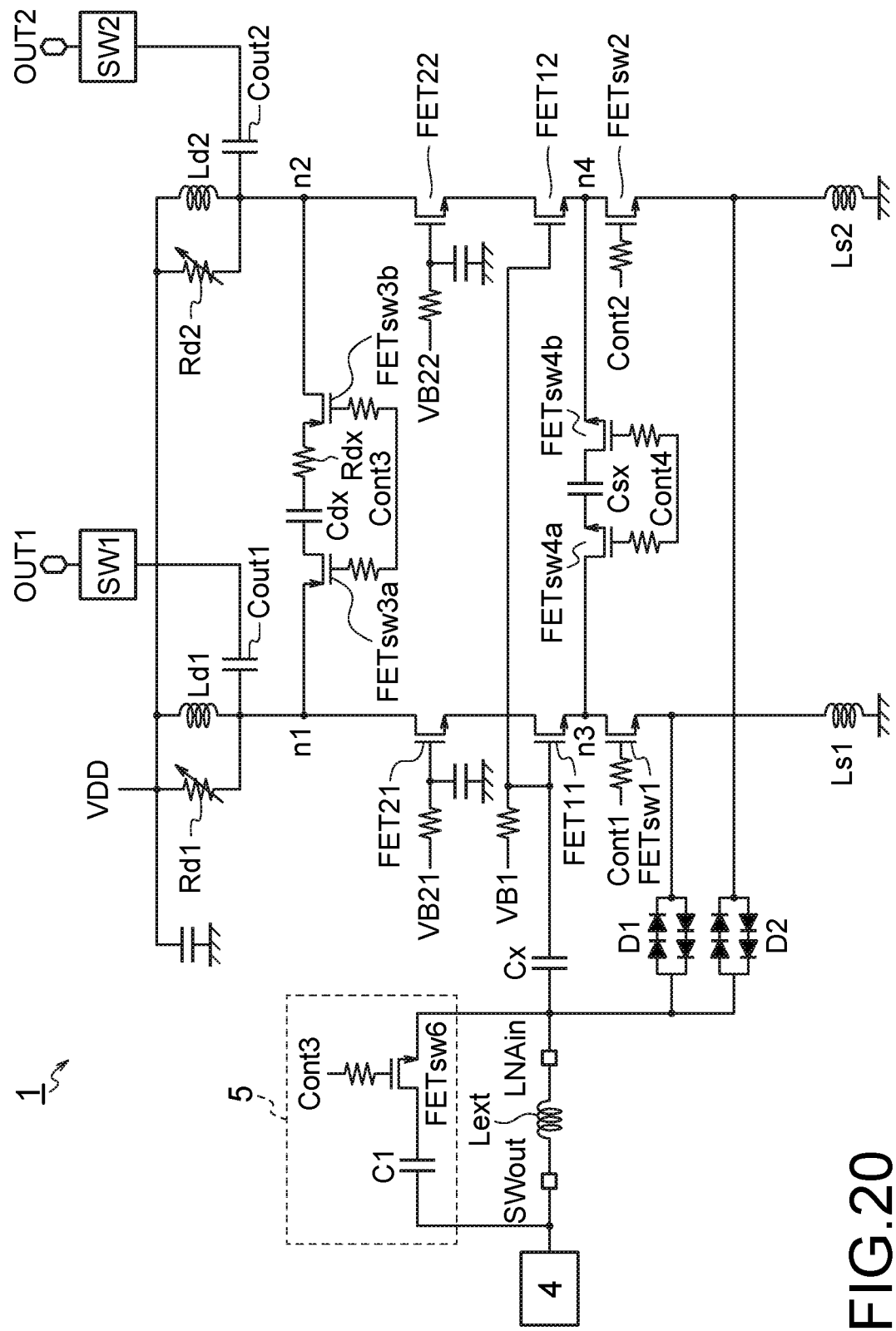
FIG. 20 is a circuitry diagram illustrating an example of an LNA according to an embodiment.

FIG. 20 illustrates this embodiment in which the connection position of the ΔNF improving circuitry 20 is set between the nodes n3 and n4. In other words, the ΔNF improving circuitry 20 is moved to the position in FIG. 2. Even by changing the connection position in this manner, the same effect can be obtained.

Third Embodiment

Figure 21:
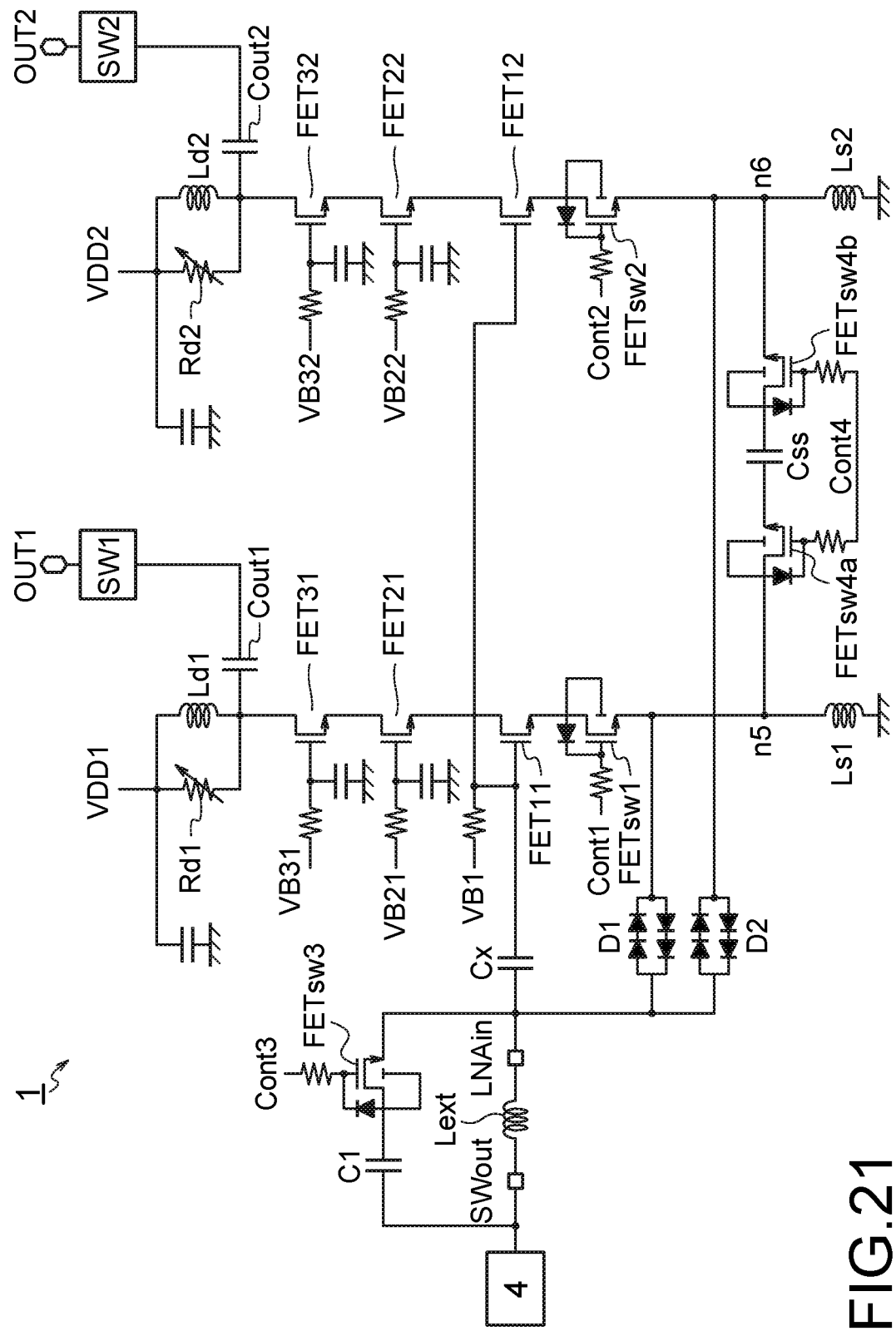
FIG. 21 is a circuitry diagram illustrating an example of an LNA according to an embodiment.

FIG. 21 is a diagram illustrating an example of an LNA1 according to this embodiment. A first amplifier circuitry 2 and a second amplifier circuitry 3 are basically the same as those in the first embodiment, but a grounded-gate transistor is increased by one stage. Further, the S23 improving circuitry 10 is removed instead of increasing the grounded-gate transistor.

The first amplifier circuitry 2 further includes a fifth transistor FET31 between a drain of a third transistor FET21 whose gate is grounded in a high-frequency manner and a first output matching circuitry. The fifth transistor FET31 has a gate grounded in a high-frequency manner, a source connected to the drain of the third transistor FET21, and a drain connected to an output port OUT1 via the first output matching circuitry.

Similarly, the second amplifier circuitry 3 includes a sixth transistor FET32 whose gate is grounded in a high-frequency manner, and the sixth transistor FET32 has a source connected to a drain of a fourth transistor FET22, and a drain connected to an output port OUT2 via a second output matching circuitry.

To the fifth transistor FET31 and the sixth transistor FET32, bias voltages with which they become the same on/off states as those of the third transistor FET21 and the fourth transistor FET22 in synchronization therewith respectively are applied.

Note that other power supply voltages VDD1, VDD2 are inputted to the output matching circuitry, but the power supply voltages are not limited to them. For example, the VDD1, VDD2 may be a common VDD as in the above-explained LNA1.

FIG. 22 is a table listing the state of the switch or the state of the voltage to be applied in each mode. The table is basically the same as in the above-explained first embodiment and second embodiment, but the voltages to be applied to the gates of the fifth transistor FET31 and the sixth transistor FET32 are additionally listed. As listed in the table, a bias voltage VB21 to be applied to the gate of the third transistor FET21 and a bias voltage to be applied to the gate of the fifth transistor FET31 are similarly controlled in each mode.

More specifically, the bias voltages VB21, VB31 are turned on in the first single output mode and the split output mode and turned off in the second single output mode. By such a control, the output from the first amplifier circuitry 2 is controlled. The same applies to the bias voltage VB32 to be applied to the gate of the sixth transistor FET32, and the bias voltage VB32 is turned on in the second single output mode and the split output mode where there is output from the second amplifier circuitry 3, and turned off in the first single output mode. Note that it is desirable that the voltages during on of VB31 and VB32 are higher than the voltages during on of VB21 and VB22.

Hereinafter, the simulation result about the parameter and so on indicating the input/output characteristics during the single output mode and during the split output mode in this embodiment will be explained. For example, the power supply voltage was set to 1.8 V and the frequency range as a target was set to the Band41.

Figure 23:
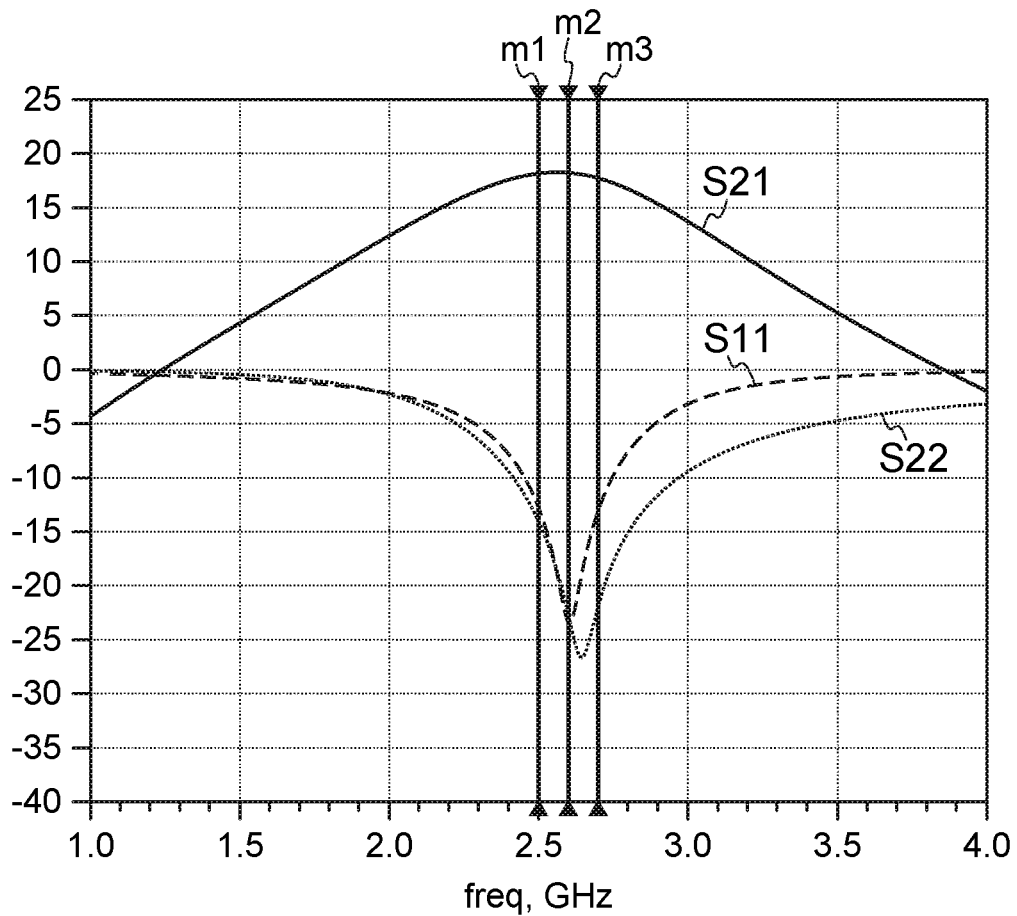
FIG. 23 is a chart illustrating an S parameter in a single output mode of the circuitry in FIG. 21.

FIG. 23 is a chart illustrating the S parameter being the input/output characteristics during the single output mode by the LNA1 according to this embodiment.

As illustrated in the chart, it is found that the curve of S21 indicates a high value in the focused frequency range. On the other hand, it is found that curves of S11 and S22 are kept low in the focused frequency range.

The gain in the single output mode is approximately 18 dB. Further, S11 satisfies the value (−8 dB or less) generally required within the range. S22 also satisfies the value (−12 dB or less) generally required within the range.

Figure 24:
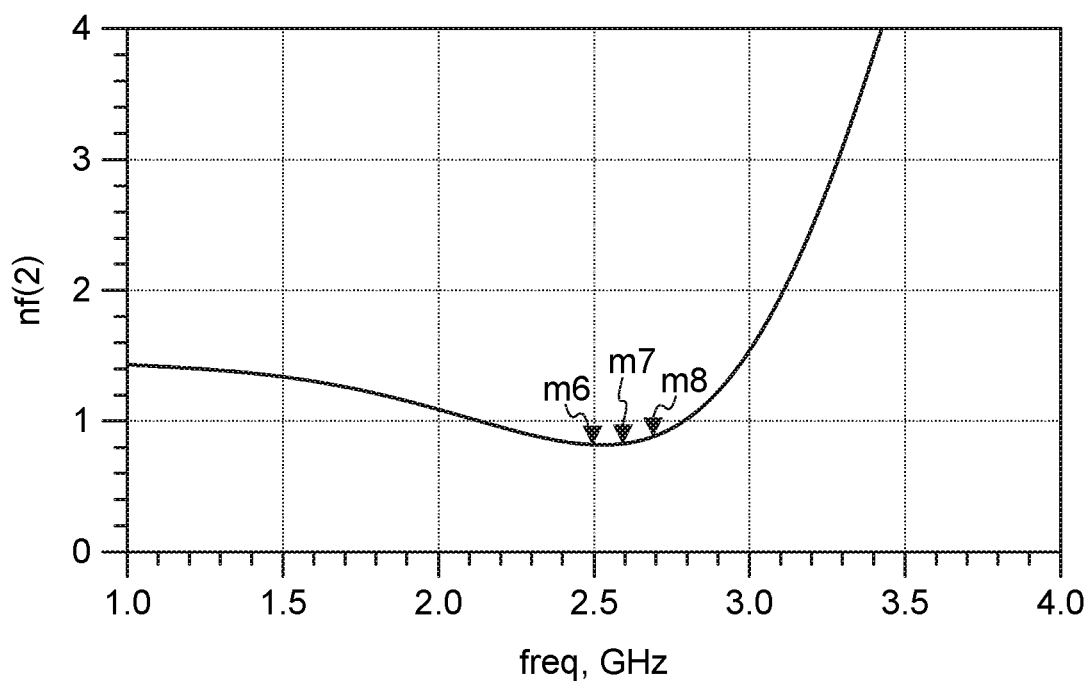
FIG. 24 is a chart illustrating an NF in the single output mode of the circuitry in FIG. 21.

FIG. 24 is a chart illustrating the NF during the single output mode by the LNA1 according to this embodiment. The NF indicates excellent characteristics at the level not exceeding 0.89 dB in the observed frequency band.

Figure 25:
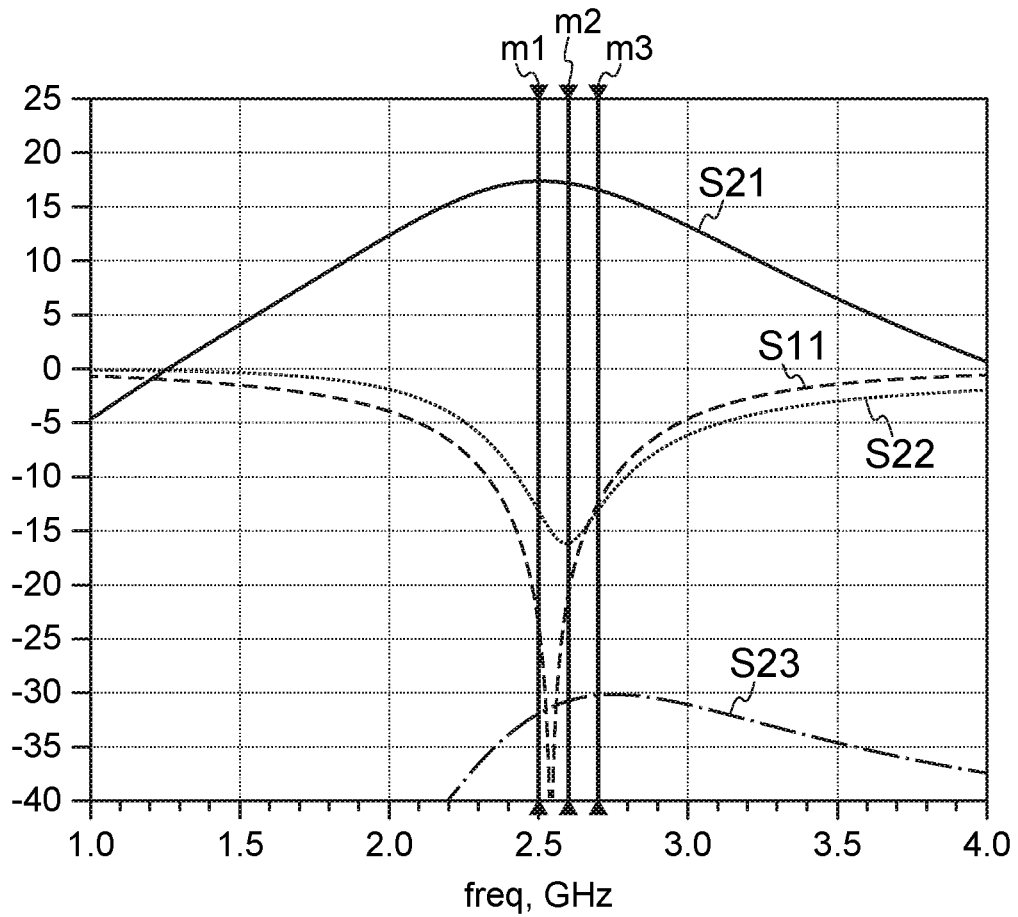
FIG. 25 is a chart illustrating the S parameter in a split output mode of the circuitry in FIG. 21.

FIG. 25 is a chart illustrating the S parameter during the split output mode by the LNA1 according to this embodiment. As is found from the chart, the curve of S21 takes a high value in the focused frequency range. It is found, on the other hand, that the curves of S11, S22, and S23 are kept low in the focused frequency range. The gain in the split output mode is approximately 17 dB. Further, S23 is −30.2 dB which satisfies the generally required value (−25 dB or less).

S23 in the single output mode secures the isolation between the port 2 and the port 3 by the isolation of SW1 and SW2 in the off states though not clearly indicated.

Figure 26:
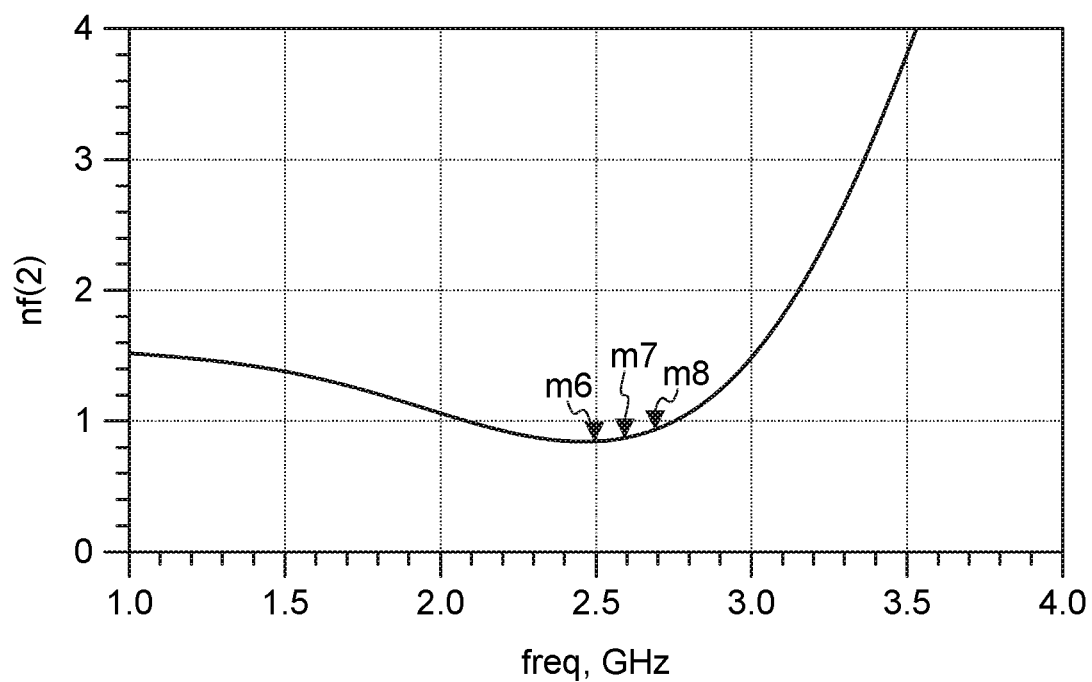
FIG. 26 is a chart illustrating the NF in the split output mode of the circuitry in FIG. 21.

FIG. 26 is a chart illustrating the noise figure during the split output mode by the LNA1 according to this embodiment. The noise figure indicates excellent characteristics at the level not exceeding 0.94 dB in the observed frequency band. It should be noted that the noise figure at the center of the range in the split output mode is deteriorated only by 0.04 dB with respect to that in the single output mode.

FIG. 27 is a table of a summary of the above-explained parameters and so on. In this embodiment, as an example, the bias current is 5.94 mA in the single output mode, and is 11.87 mA in the split output mode.

As explained above, according to this embodiment, the LNA having the single output mode and the split output mode includes the S23 improving circuitry 10 which improves the isolation between the outputs and the ΔNF improving circuitry 20 which improves the noise characteristics and thereby can increase the isolation between the outputs and reduce the noise. Further, the amplifier circuitry and so on can be arranged on the same SOI as that for the SPnT switch 4 which functions as the band select switch, so that downsizing and reduction in power consumption can be expected. Furthermore, the LNA includes the ESD protection circuitry and thereby has resistance also about the electrostatic discharge. Further, increasing the cascode-connected transistors to three stages can make the ΔNF characteristics better than those in the above-explained embodiments.

Figure 28:
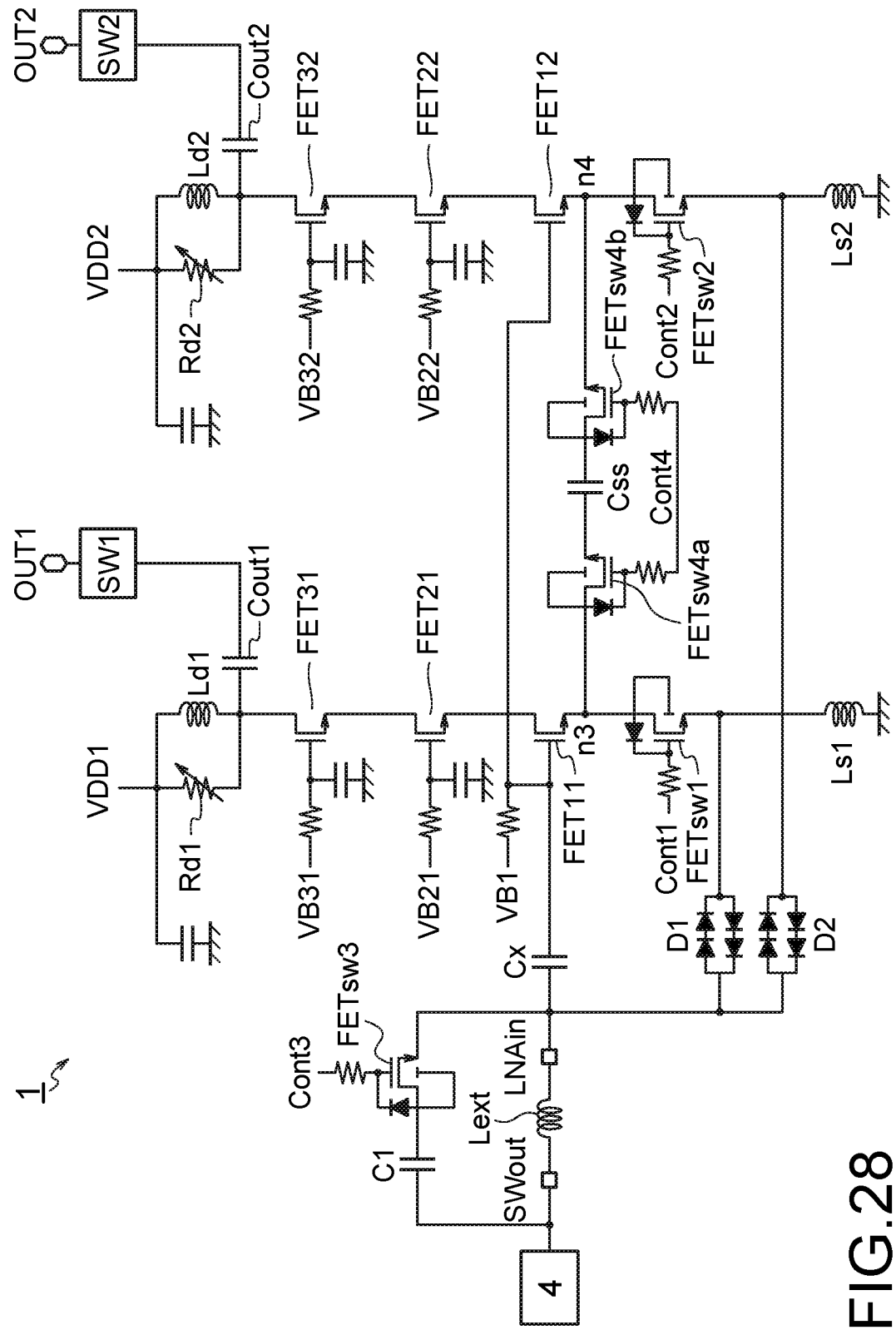
FIG. 28 is a circuitry diagram illustrating an example of an LNA according to an embodiment.

FIG. 28 is a diagram illustrating another example of this embodiment. The ΔNF improving circuitry 20 connects the first amplifier circuitry 2 and the second amplifier circuitry 3 at the nodes n5 and n6 in the above-explained example, whereas the ΔNF improving circuitry 20 connects the first amplifier circuitry 2 and the second amplifier circuitry 3 at the nodes n3 and n4 in this example. Even by changing the connection position in this manner, the same effect can be obtained.

Fourth Embodiment

Figure 29:
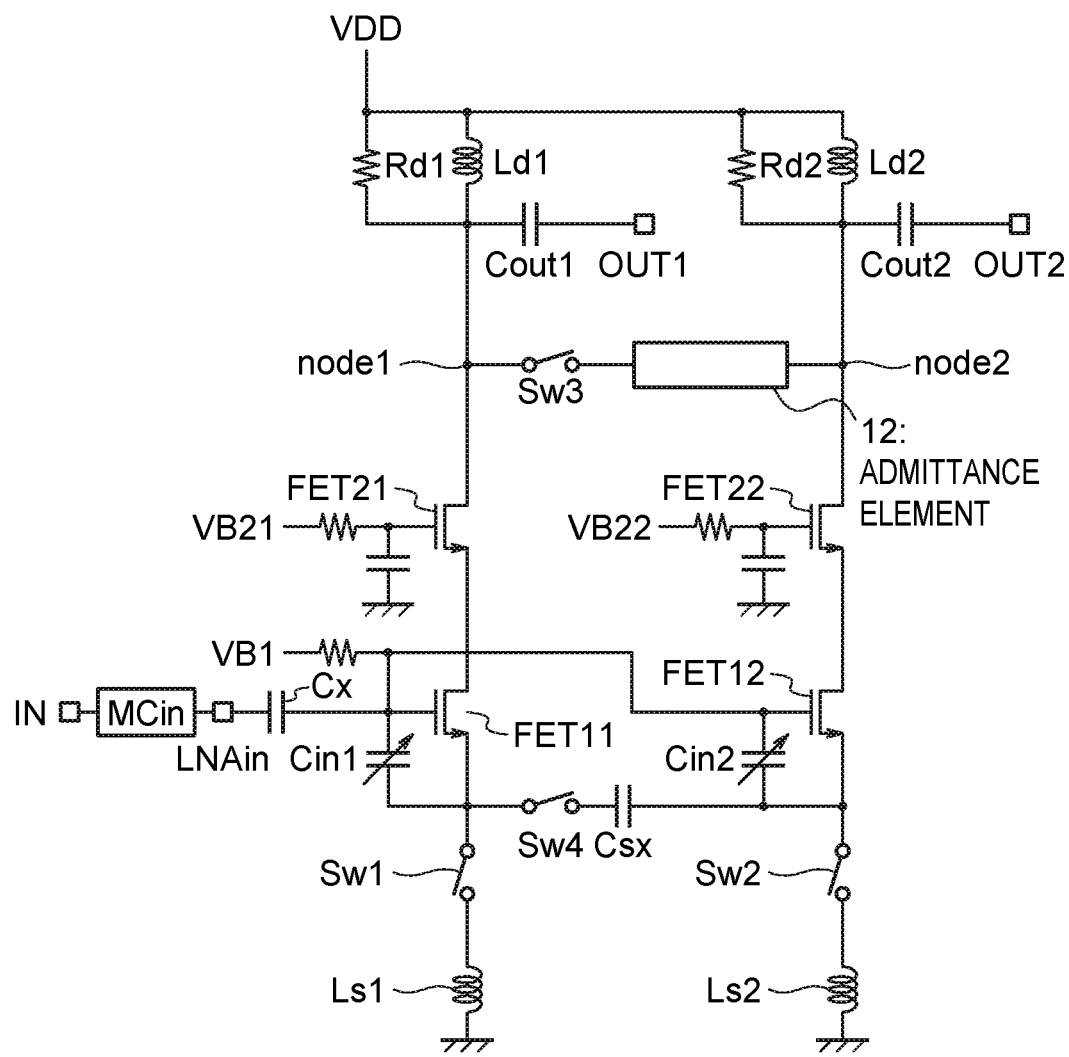
FIG. 29 is a circuitry diagram illustrating an example of an LNA according to an embodiment.

FIG. 29 is a diagram illustrating an example of an LNA1 according to this embodiment. In this embodiment, an S23 improving circuitry 10 will be explained. A first amplifier circuitry 2 and a second amplifier circuitry 3 are basically the same as those in the above-explained first embodiment. Note that only one of each of a third switch Sw3 and a fourth switch Sw4 is illustrated, but the third switches Sw3 and the fourth switches Sw4 may be provided to sandwich circuitry elements in an S23 improving circuitry 10 and a ΔNF improving circuitry 20 respectively as in the above-explained embodiments. Capacitors Cin1, Cin2 in the ΔNF improving circuitry 20 are, for example, variable resistors, and provided for matching the impedances in the single output mode and the split output mode.

Here, it should be noted that an input matching circuitry MCin is provided at a stage preceding to an input port LNAin in FIG. 29, and an input port IN in FIG. 29 is an input of the MCin. Note that the component of the MCin is, for example, the Lext in FIG. 5.

FIG. 30 is a table listing the state of the switch or the state of the voltage to be applied in each mode, and basically the same as in the above-explained embodiments.

An admittance element 12 is decided based on Y21 of a Y parameter (admittance matrix) when an input port IN is terminated in 50Ω, the output matching circuitry is removed, and the node n1 is the first port and the node n2 is the second port in the split output mode.

Figure 31:
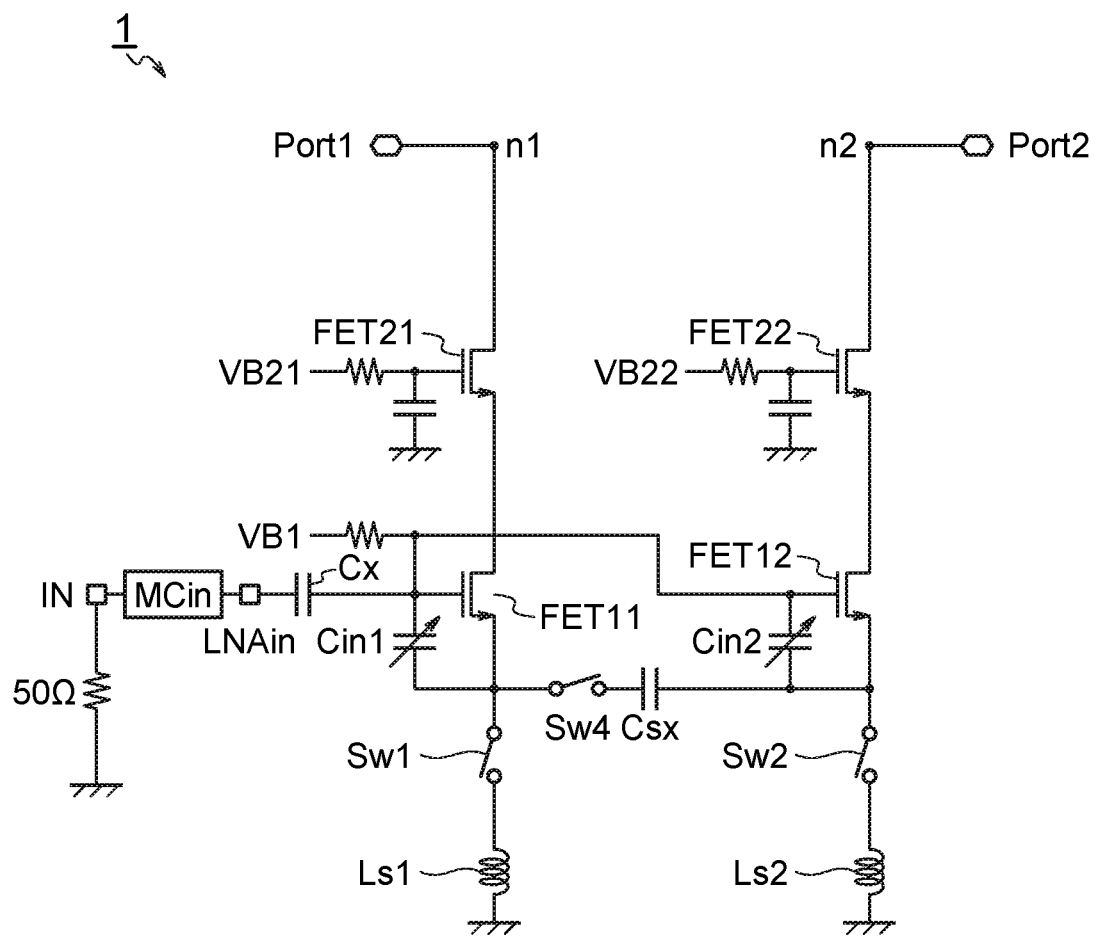
FIG. 31 is a circuitry diagram illustrating an example of an S23 improving circuitry according to FIG. 29.

FIG. 31 illustrates a circuitry which adjusts the admittance of the admittance element 12. The input node IN is terminated in 50Ω. A first port Port1 is connected to the node n1, and a second port Port2 is connected to the node n2. To the nodes n1, n2, the same potentials as the bias potentials applied in the split output mode are applied.

To evaluate the Y parameter in this state, bias tees are provided at the Port1, Port2, a predetermined potential is applied thereon, and the S parameter is then measured and converted into the Y parameter. In this embodiment, the admittance of the admittance element 12 is set to be substantially equal to a Y12 component of the Y parameter obtained in the above in the frequency of the center of the range. With this admittance value, the isolation between outputs is improved. The decision of the admittance value may be actually evaluated and measured, or performed by simulation.

Hereinafter, the simulation result about the parameter and so on indicating the input/output characteristics during the single output mode and during the split output mode in this embodiment will be explained. For example, the power supply voltage was set to 1.8 V and the frequency range as a target was set to the Band41.

Figure 32:
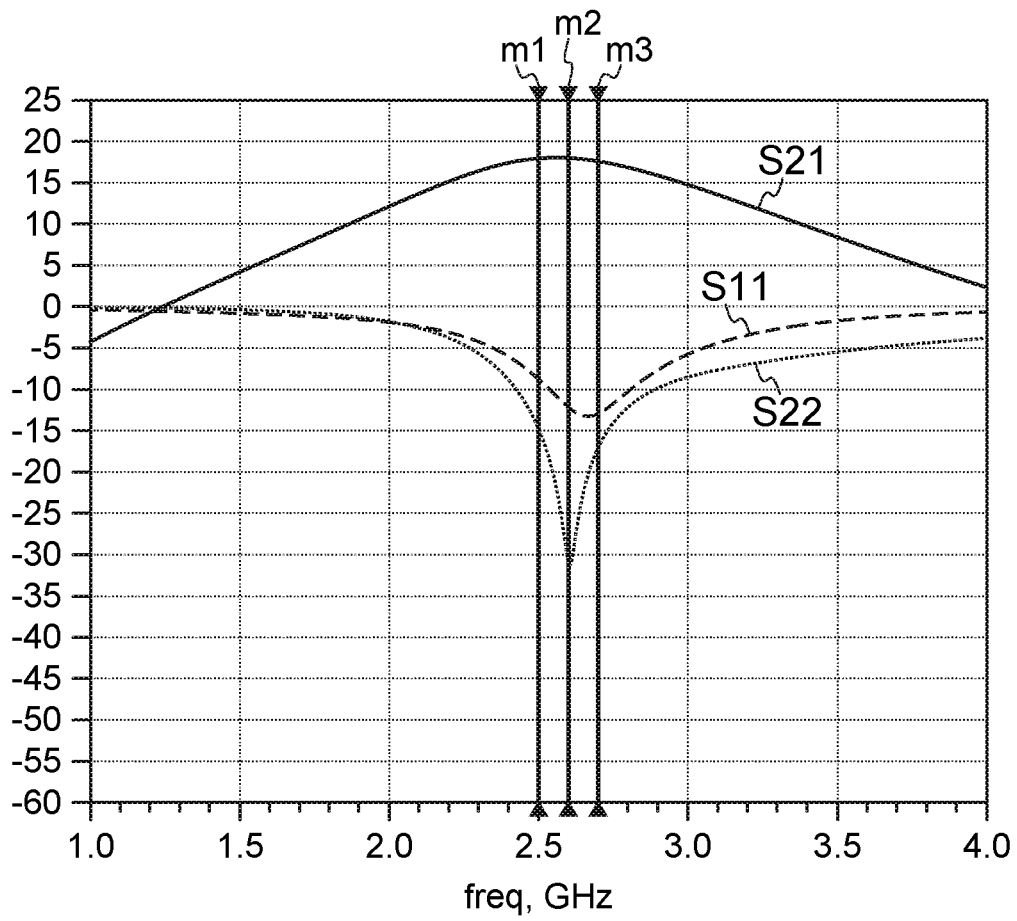
FIG. 32 is a chart illustrating an S parameter in a single output mode of the circuitry in FIG. 29.

FIG. 32 is a chart illustrating the S parameter being the input/output characteristics during the single output mode by the LNA1 according to this embodiment.

As illustrated in the chart, it is found that the curve of S21 indicates a high value in the focused frequency range. On the other hand, it is found that curves of S11 and S22 are kept low in the focused frequency range.

The gain in the single output mode is approximately 18 dB. Further, S11 satisfies the value (−8 dB or less) generally required within the range. S22 also satisfies the value (−12 dB or less) generally required within the range.

Figure 33:
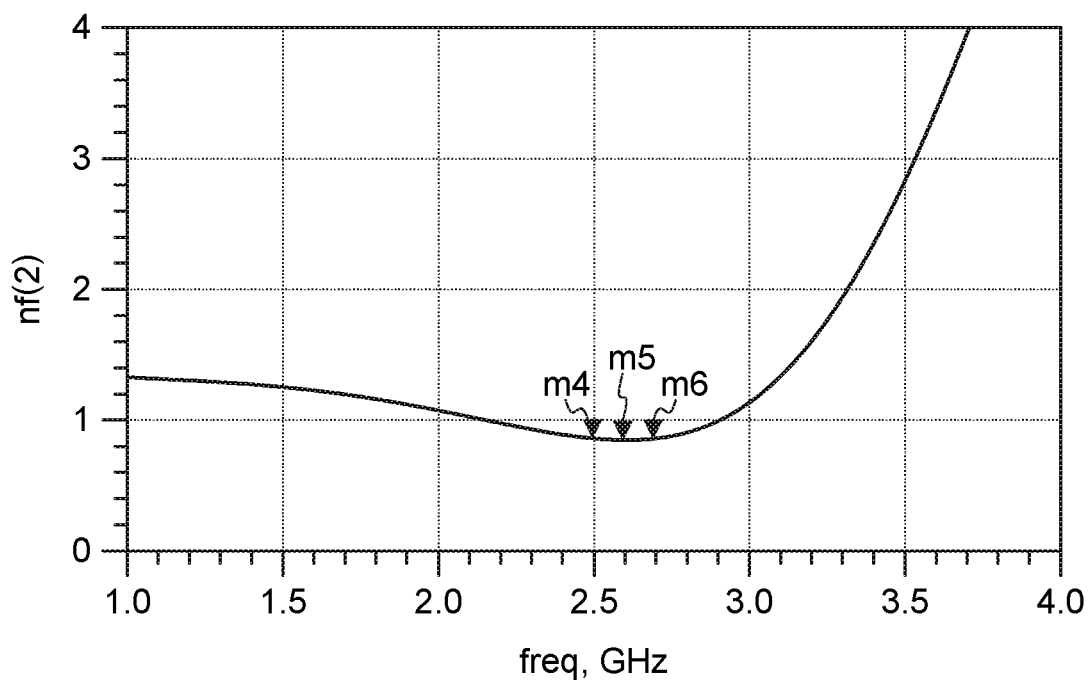
FIG. 33 is a chart illustrating an NF in the single output mode of the circuitry in FIG. 29.

FIG. 33 is a chart illustrating the NF during the single output mode by the LNA1 according to this embodiment. The NF indicates excellent characteristics at the level not exceeding 0.86 dB in the observed frequency band.

Figure 34:
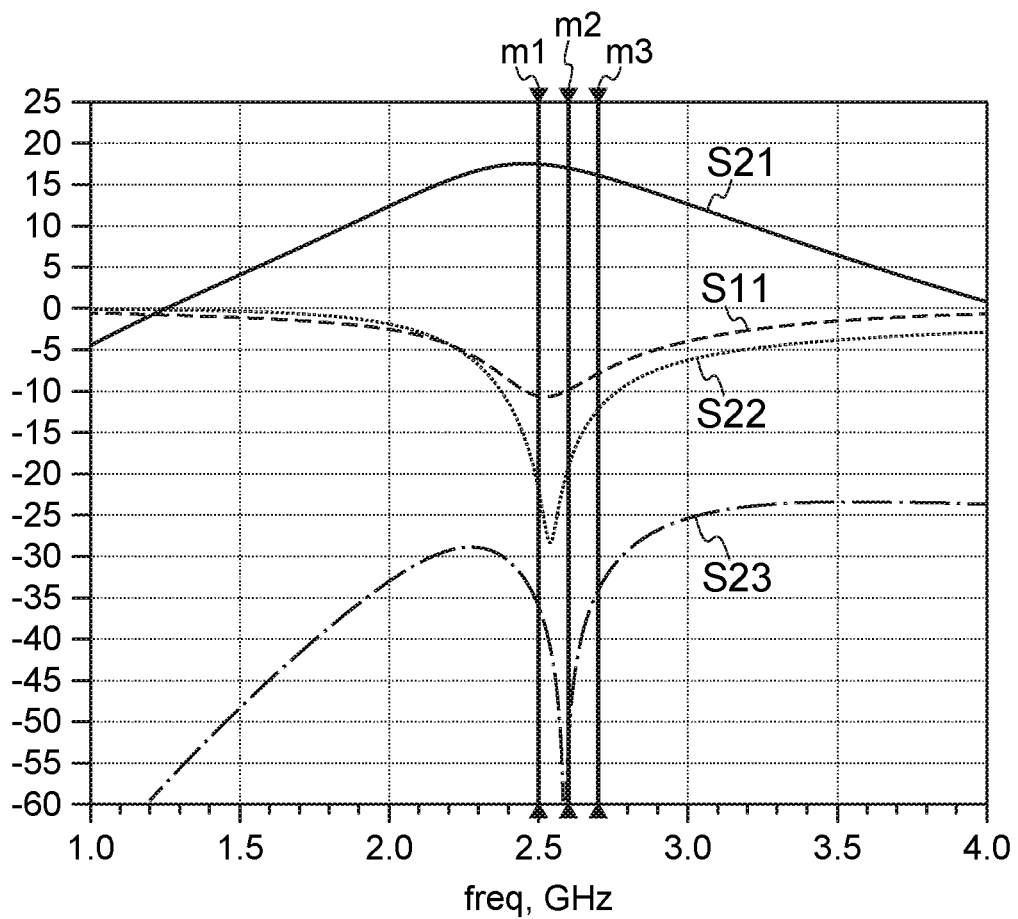
FIG. 34 is a chart illustrating the S parameter in a split output mode of the circuitry in FIG. 29.

FIG. 34 is a chart illustrating the S parameter during the split output mode by the LNA1 according to this embodiment. As is found from the chart, the curve of S21 takes a high value in the focused frequency range. It is found, on the other hand, that the curves of S11, S22, and S23 are kept low in the focused frequency range. The gain in the split output mode is approximately 17 dB. Further, S23 is −34.8 dB which satisfies the generally required value (−25 dB or less).

Figure 35:
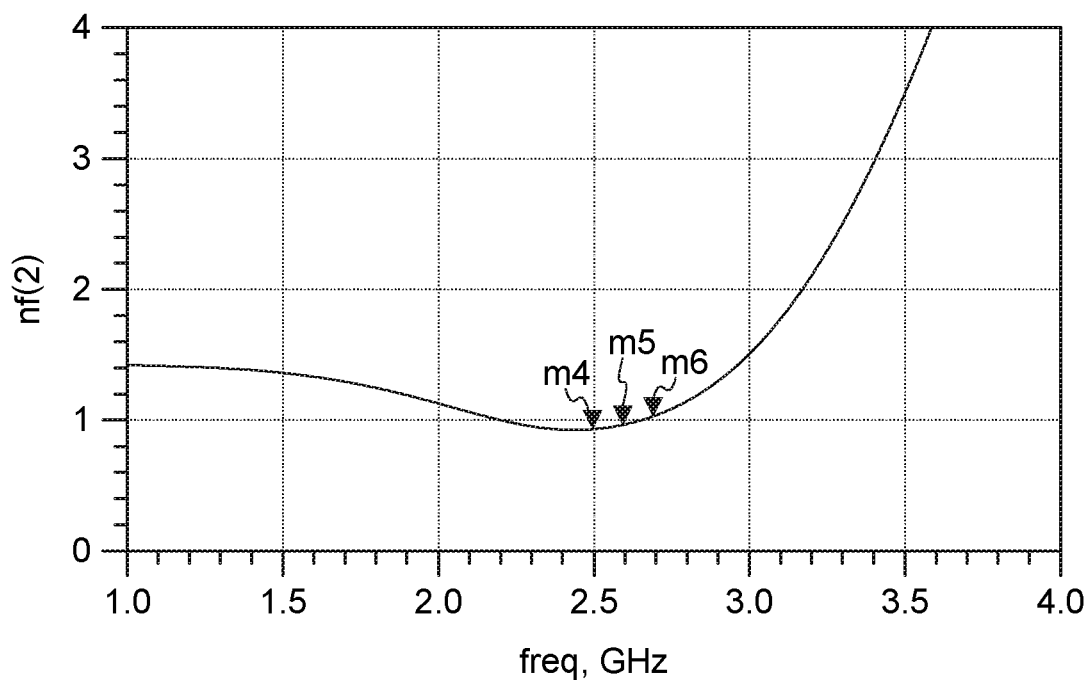
FIG. 35 is a chart illustrating the NF in the split output mode of the circuitry in FIG. 29.

FIG. 35 is a chart illustrating the noise figure during the split output mode by the LNA1 according to this embodiment. The noise figure indicates excellent characteristics at the level not exceeding 1.03 dB in the observed frequency band. It should be noted that the noise figure at the center of the range in the split output mode is deteriorated only by 0.17 dB with respect to that in the single output mode.

FIG. 36 is a table of a summary of the above-explained parameters and so on. In this embodiment, as an example, the bias current is 6.3 mA in the single output mode, and is 12.6 mA in the split output mode.

Figure 37:
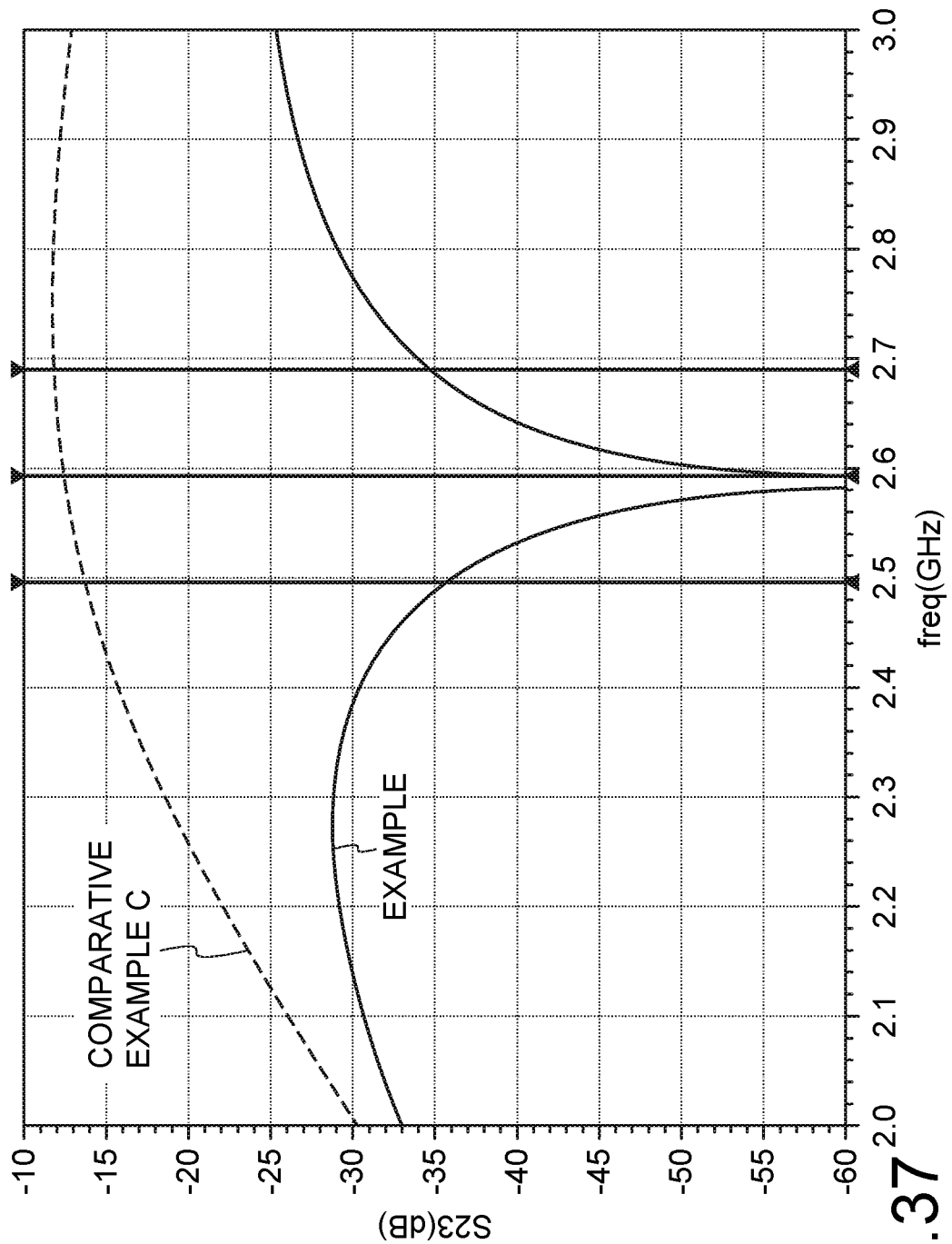
FIG. 37 is a graph illustrating characteristics in the case where the S23 improving circuitry is not provided in the circuitry in FIG. 29.

FIG. 37 is a chart illustrating a comparison of S23 with respect to Comparative Example C in which the admittance element 12 is removed (the third switch Sw3 may also be removed). Comparing in worst value in the focused range of the Band41, S23 of the LNA1 according to this embodiment is better by about 22.8 dB than Comparative Example C.

As explained above, according to this embodiment, the LNA having the single output mode and the split output mode includes the S23 improving circuitry 10 which improves the isolation between the outputs and the ΔNF improving circuitry 20 which improves the noise characteristics and thereby can increase the isolation between the outputs and reduce the noise. Further, the amplifier circuitry and so on can be arranged on the same SOI as that for the SPnT switch 4 which functions as the band select switch, so that downsizing and reduction in power consumption can be expected. Further, calculation of the admittance of the admittance element 12 from the S parameter with respect to the circuitry illustrated in FIG. 31 makes it possible to reduce the value of S23 indicating the transmission characteristics between the output ports.

Fifth Embodiment

Figure 38:
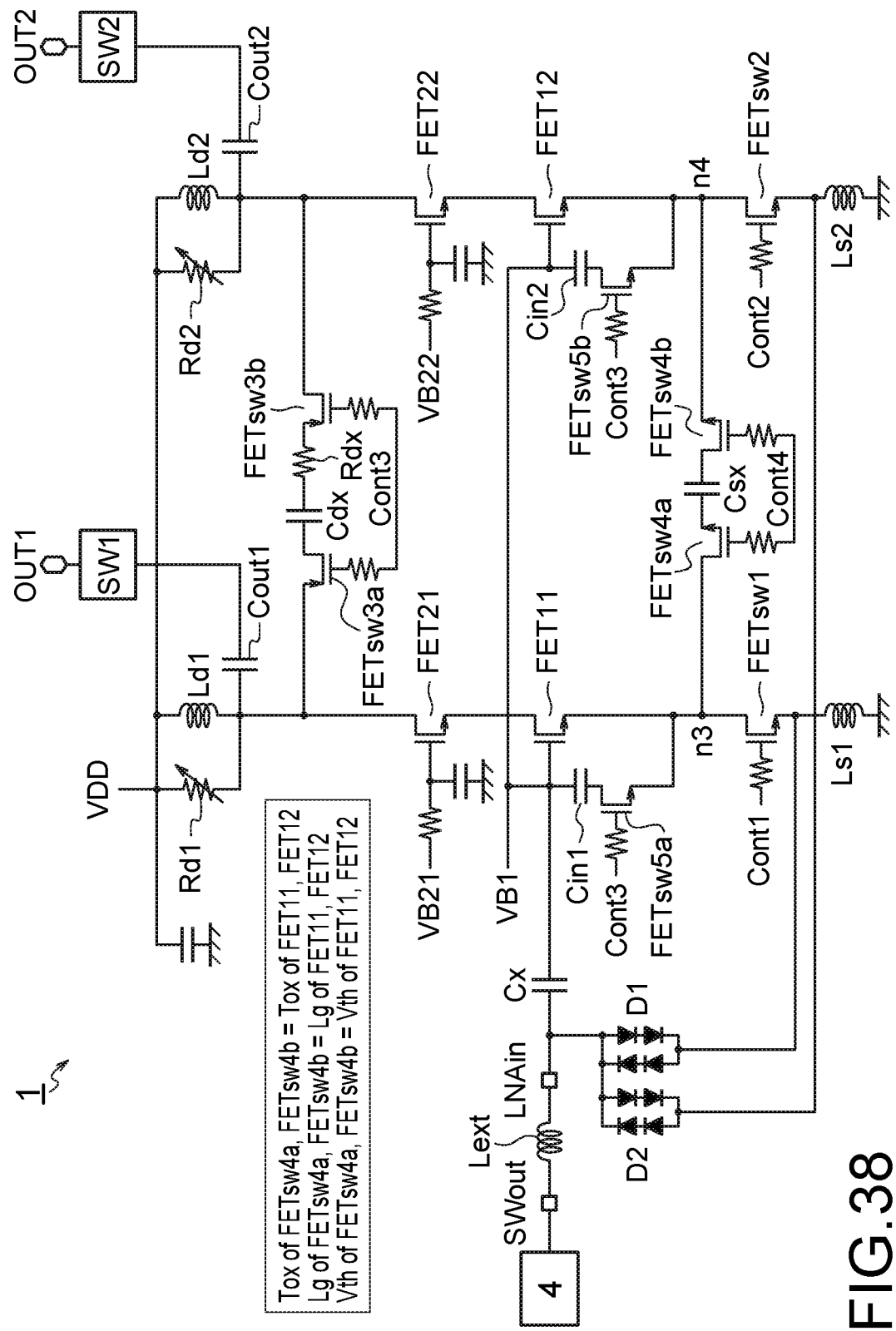
FIG. 38 is a circuitry diagram illustrating an example of an LNA according to an embodiment.

FIG. 38 is a diagram illustrating an example of an LNA1 according to this embodiment. A first amplifier circuitry 2 and a second amplifier circuitry 3 are basically the same as those in the above-explained embodiments. Limitation is applied on fourth switches FETsw4a, FETsw4b included in a ΔNF improving circuitry 20 to further improve the accuracy.

In this embodiment, the fourth switch FETsw4a is equal to a first transistor FET11 in gate oxide film thickness, gate length, and threshold voltage. Similarly, the fourth switch FETsw4b is equal to a second transistor FET12 in gate oxide film thickness, gate length, and threshold voltage. Basically, the same transistors are used for the first transistor FET11 and the second transistor FET12, so that all of the first transistor FET11, the second transistor FET12, and transistors provided in the fourth switches FETsw4a, FETsw4b may be the same.

As in the above-explained embodiments, the fourth switches FETsw4a, FETsw4b are switches which switch between enable and disable of a capacitor Csx and switches which switch the connection state of the ΔNF improving circuitry 20 according to the output mode.

In the circuitry in FIG. 38, the state of the switch or the state of the voltage to be applied in each mode is as listed in FIG. 6 as in the first embodiment. When the Cont3 is High, namely, in the single output mode, the seventh switch FETsw6 is turned on, the capacitor C1 is connected in parallel with the external inductor Lext, and matching of the input signal is performed. When a signal is inputted to each switch or the like as illustrated in FIG. 6, the mode such as the first single output mode, the second single output mode, or the split output mode is changed in the LNA1 in FIG. 38.

The simulation result about this embodiment is the same as explained about the above-explained first embodiment. For details, the explanation of the above-explained first embodiment and parameters and so on illustrated in FIG. 7 to FIG. 11 should be referred to.

As explained above, according to this embodiment, the LNA having the single output mode and the split output mode includes the S23 improving circuitry 10 which improves the isolation between the outputs and the ΔNF improving circuitry 20 which improves the noise characteristics and thereby can increase the isolation between the outputs and reduce the noise. Further, the amplifier circuitry and so on can be arranged on the same SOI as that for the SPnT switch 4 which functions as the band select switch, so that downsizing and reduction in power consumption can be expected.

The fourth switches FETsw4a, FETsw4b can be formed to have an oxide film thickness Tox and a gate length Lg which are the same as those of the first transistor FET11 and the second transistor FET12 and, for example, possible minimum values. Further, the threshold voltage Vth is also designed to be the same low value as that of the first transistor FET11 or the like, for example, 0.35 V, so that the noise generated here can be made low as compared with the case of the transistors having other circuit constants. Note that making the oxide film thicknesses Tox, the gate lengths Lg and the threshold values Vth of the fourth switches FETsw4a, FETsw4b the same as those of the first transistor FET11 and the second transistor FET12 possibly causes a leakage current during off, but there is no problem when transistors with small off-leakage are used for the first switch FETsw1 and the second switch FETsw2.

Having the same circuit constant in the embodiments explained in this specification does not have to be having strictly the same circuit constant, and may be having the same circuit constant, for example, in a range where even the elements having the same circuit constant may cause an individual difference or the like. The same applies to claims, and being the same does not mean being strictly the same but there may be a small difference such as individual difference or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in all of the above-explained embodiments, the n-type MOSFET may be a p-type MOSFET according to the situation and the p-type MOSFET may be an n-type MOSFET according to the situation. Further, as the MOSFET, another transistor having the same function, for example, the one which functions as a switching element by voltage, current, or another external switching signal, such as a bipolar transistor may be used. For example, in the case of using the bipolar transistor, the gate, source, drain in the explanation in this specification and claims may be replaced in reading with an appropriate combination of a base, a collector (emitter), and an emitter (collector), respectively. In any replacement in reading, the physical amount used for switching such as the magnitude of the voltage to be applied to the gate, the current to be applied to the base or the like can be appropriately replaced in reading so as to appropriately perform the equivalent operation as the one having the above-described functions by the characteristics of the elements.

The invention claimed is:

1. A high-frequency amplifier circuitry, comprising:
a first amplifier circuitry comprising a first transistor and a grounded-gate third transistor which are cascode-connected, the first transistor having a source grounded via a first source inductor and a gate to which an input signal is applied, the third transistor configured to output from a drain a signal obtained by amplifying a signal outputted from a drain of the first transistor; and
a second amplifier circuitry having a same circuit constant as a circuit constant of the first amplifier circuitry and comprising a second transistor and a grounded-gate fourth transistor which are cascode-connected, the second transistor having a source grounded via a second source inductor and a gate to which the input signal is applied, the fourth transistor configured to output from a drain a signal obtained by amplifying a signal outputted from a drain of the second transistor; and
a noise figure improving circuitry connecting the source of the first transistor and the source of the second transistor to each other, and
having a single output mode of outputting the amplified signal from one of the first amplifier circuitry and the second amplifier circuitry, and a split output mode of outputting the amplified signal from both of the first amplifier circuitry and the second amplifier circuitry.

2. The high-frequency amplifier circuitry according to claim 1, further comprising:
a first switch connected between the first source inductor and the first transistor, turned on when the amplified signal is outputted from the first amplifier circuitry and turned off when the amplified signal is not outputted from the first amplifier circuitry; and
a second switch connected between the second source inductor and the second transistor, turned on when the amplified signal is outputted from the second amplifier circuitry and turned off when the amplified signal is not outputted from the second amplifier circuitry, wherein
the noise figure improving circuitry is connected between the first transistor and the first switch and between the second transistor and the second switch.

3. The high-frequency amplifier circuitry according to claim 1, further comprising:
a first switch connected between the first source inductor and the first transistor, turned on when the amplified signal is outputted from the first amplifier circuitry and turned off when the amplified signal is not outputted from the first amplifier circuitry; and
a second switch connected between the second source inductor and the second transistor, turned on when the amplified signal is outputted from the second amplifier circuitry and turned off when the amplified signal is not outputted from the second amplifier circuitry, wherein
the noise figure improving circuitry is connected between the first switch and the first source inductor and between the second switch and the second source inductor.

4. The high-frequency amplifier circuitry according to claim 1, wherein a capacitance value of the capacitor of the noise figure improving circuitry is set so that the capacitor forms a noise transmission path through which a noise voltage induced by the source of the second transistor is transmitted to the gate of the first transistor and a phase of the noise via the noise transmission path is shifted by 180° from a phase of the noise transmitted to the gate of the first transistor not via the noise transmission path.

5. The high-frequency amplifier circuitry according to claim 1, wherein the noise figure improving circuitry is enabled in a case of the split output mode and disabled in a case of the single output mode.

6. The high-frequency amplifier circuitry according to claim 5, wherein:
the noise figure improving circuitry comprises a noise figure improving element, a noise figure improving circuitry first changeover switch, and a noise figure improving circuitry second changeover switch;
the noise figure improving circuitry first changeover switch comprises a transistor which is provided between the first amplifier circuitry and the noise figure improving element, turned off in the single output mode and turned on in the split output mode, and is equal to the first transistor in gate oxide film thickness, gate length and threshold voltage;
the noise figure improving circuitry second changeover switch comprises a transistor which is provided between the second amplifier circuitry and the noise figure improving element, turned off in the single output mode and turned on in the split output mode, and is equal to the second transistor in gate oxide film thickness, gate length and threshold voltage; and the noise figure improving element is provided to make a noise figure in the split output mode have a small difference from a noise figure in the single output mode, as compared with a case where the noise figure improving element is not provided.

7. The high-frequency amplifier circuitry according to claim 1, further comprising an isolation improving circuitry connecting the drain of the third transistor and the drain of the fourth transistor to each other via a circuitry having a capacitor and a resistor connected in series.

8. The high-frequency amplifier circuitry according to claim 7, wherein a value of admittance of the isolation improving circuitry, based on a value of a Y21 component of an admittance matrix of a circuitry obtained by:
removing a circuitry element connected to the drain of the third transistor;
removing a circuitry element connected to the drain of the fourth transistor;
using the drain of the third transistor as a first port;
using the drain of the fourth transistor as a second port; and
50Ω terminating an input of an input matching circuitry provided on input sides of the first and second transistors.

9. The high-frequency amplifier circuitry according to claim 7, wherein the isolation improving circuitry is enabled in a case of the split output mode and disabled in a case of the single output mode.

10. The high-frequency amplifier circuitry according to claim 1, further comprising:
a first electrostatic discharge protection circuitry provided between a node between the source of the first transistor and the first source inductor, and, a node on an input side of a capacitance connected between the gate of the first transistor and an input terminal; and
a second electrostatic discharge protection circuitry provided between a node between the source of the second transistor and the second source inductor, and, the node on the input side of the capacitance.

11. The high-frequency amplifier circuitry according to claim 1, further comprising:
a first output matching circuitry comprising a first output matching resistor and a first output matching inductor which are provided in parallel between the drain of the third transistor and a power supply voltage, and a first output matching capacitor connected in series both with the drain of the third transistor and with the first output matching resistor and the first output matching inductor, the amplified signal being outputted from the drain of the third transistor via the first output matching capacitor; and
a second output matching circuitry comprising a second output matching resistor and a second output matching inductor which are provided in parallel between the drain of the fourth transistor and the power supply voltage, and a second output matching capacitor connected in series both with the drain of the fourth transistor and with the second output matching resistor and the second output matching inductor, the amplified signal being outputted from the drain of the fourth transistor via the second output matching capacitor.

12. The high-frequency amplifier circuitry according to claim 1, further comprising:
a fifth transistor having a source connected to the drain of the third transistor and a gate grounded; and
a sixth transistor having a source connected to the drain of the fourth transistor and a gate grounded, wherein:

the first amplifier circuitry outputs the amplified signal from the drain of the fifth transistor; and the second amplifier circuitry outputs the amplified signal from the drain of the sixth transistor.

13. The high-frequency amplifier circuitry according to claim 12, further comprising:
   a first output matching circuitry comprising a first output matching resistor and a first output matching inductor which are provided in parallel between the drain of the fifth transistor and a power supply voltage, and a first output matching capacitor connected in series both with the drain of the fifth transistor and with the first output matching resistor and the first output matching inductor, the amplified signal being outputted from the drain of the fifth transistor via the first output matching capacitor; and
   a second output matching circuitry comprising a second output matching resistor and a second output matching inductor which are provided in parallel between the drain of the sixth transistor and the power supply voltage, and a second output matching capacitor connected in series both with the drain of the sixth transistor and with the second output matching resistor and the second output matching inductor, the amplified signal being outputted from the drain of the sixth transistor via the second output matching capacitor.

14. The high-frequency amplifier circuitry according to claim 1, further comprising:
   an SPnT (Single-Pole/n-Throw) switch configured to select signals of a plurality of frequencies and output the input signal; and
   an input matching circuitry configured to match the input signal between the modes.

15. A high-frequency amplifier circuitry, comprising:
   a first amplifier circuitry comprising a first transistor and a grounded-gate third transistor which are cascode-connected, the first transistor having a source grounded via a first source inductor and a gate to which an input signal is applied, the third transistor configured to output from a drain a signal obtained by amplifying a signal outputted from a drain of the first transistor; and
   a second amplifier circuitry having a same circuit constant as a circuit constant of the first amplifier circuitry and comprising a second transistor and a grounded-gate fourth transistor which are cascode-connected, the second transistor having a source grounded via a second source inductor and a gate to which the input signal is applied, the fourth transistor configured to output from a drain a signal obtained by amplifying a signal outputted from a drain of the second transistor; and
   an isolation improving circuitry connecting the drain of the third transistor and the drain of the fourth transistor to each other via a circuitry having a capacitor and a resistor connected in series, and
   having a single output mode of outputting the amplified signal from one of the first amplifier circuitry and the second amplifier circuitry, and a split output mode of outputting the amplified signal from both of the first amplifier circuitry and the second amplifier circuitry.

16. The high-frequency amplifier circuitry according to claim 15, further comprising:
   an SPnT (Single-Pole/n-Throw) switch configured to select signals of a plurality of frequencies and output the input signal; and
   an input matching circuitry configured to match the input signal between the modes.

17. A semiconductor device, comprising:
   a plurality of high-frequency amplifier circuitries arranged on a silicon on insulator (SOI) substrate; and
   a high-frequency switch arranged on the SOI substrate corresponding to each of the plurality of high-frequency amplifier circuitries, and configured to select one of a plurality of high-frequency signals and supply the selected signal to a corresponding high-frequency amplifier circuitry,
   at least one of the plurality of high-frequency amplifier circuitries comprising:
      a first amplifier circuitry comprising a first transistor and a grounded-gate third transistor which are cascode-connected, the first transistor having a source grounded via a first source inductor and a gate to which an input signal is applied, the third transistor configured to output from a drain a signal obtained by amplifying a signal outputted from a drain of the first transistor; and
      a second amplifier circuitry having a same circuit constant as a circuit constant of the first amplifier circuitry and comprising a second transistor and a grounded-gate fourth transistor which are cascode-connected, the second transistor having a source grounded via a second source inductor and a gate to which the input signal is applied, the fourth transistor configured to output from a drain a signal obtained by amplifying a signal outputted from a drain of the second transistor; and
      a noise figure improving circuitry connecting the source of the first transistor and the source of the second transistor to each other, and
      having a single output mode of outputting the amplified signal from one of the first amplifier circuitry and the second amplifier circuitry, and a split output mode of outputting the amplified signal from both of the first amplifier circuitry and the second amplifier circuitry.

* * * * *